United States Patent
Irieda et al.

(10) Patent No.: US 11,742,816 B2
(45) Date of Patent: Aug. 29, 2023

(54) ACOUSTIC WAVE DEVICE, FILTER, AND MULTIPLEXER

(71) Applicant: TAIYO YUDEN CO., LTD., Tokyo (JP)

(72) Inventors: Taisei Irieda, Tokyo (JP); Tatsuya Aoki, Tokyo (JP); Mitsuhiro Habuta, Tokyo (JP); Satoshi Orito, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 697 days.

(21) Appl. No.: 16/709,546

(22) Filed: Dec. 10, 2019

(65) Prior Publication Data

US 2020/0212865 A1    Jul. 2, 2020

(30) Foreign Application Priority Data

Dec. 27, 2018   (JP) .................................. 2018-245827

(51) Int. Cl.
*H03H 3/02*   (2006.01)
*H03H 9/02*   (2006.01)
(Continued)

(52) U.S. Cl.
CPC .......... *H03H 3/02* (2013.01); *H03H 9/02015* (2013.01); *H03H 9/02133* (2013.01);
(Continued)

(58) Field of Classification Search
CPC .............. H03H 2003/021; H03H 3/02; H03H 9/02015; H03H 9/02102; H03H 9/02133;
(Continued)

(56) References Cited

U.S. PATENT DOCUMENTS 8,889,452 B2    11/2014   Iwamoto ....................... 257/415
9,123,885 B2    9/2015   Iwamoto
(Continued)

FOREIGN PATENT DOCUMENTS

CN   103296992   *   9/2013
CN   103532516   *   10/2017
(Continued)

OTHER PUBLICATIONS

CN-103296992 (Year: 2016).*
(Continued)

*Primary Examiner* — Ahmed N Sefer
(74) *Attorney, Agent, or Firm* — Stein IP, LLC

(57) ABSTRACT

An acoustic wave device includes: a substrate; a lower electrode, an air gap being interposed between the lower electrode and the substrate; a piezoelectric film located on the lower electrode; and an upper electrode located on the piezoelectric film such that a resonance region where at least a part of the piezoelectric film is interposed between the upper electrode and the lower electrode is formed and the resonance region overlaps with the air gap in plan view, wherein a surface facing the substrate across the air gap of the lower electrode in a center region of the resonance region is positioned lower than a surface closer to the piezoelectric film of the substrate in an outside of the air gap in plan view.

20 Claims, 19 Drawing Sheets

(51) Int. Cl.
*H03H 9/17* (2006.01)
*H03H 9/13* (2006.01)

(52) U.S. Cl.
CPC ........ *H03H 9/02157* (2013.01); *H03H 9/131* (2013.01); *H03H 9/132* (2013.01); *H03H 9/173* (2013.01); *H03H 2003/021* (2013.01)

(58) Field of Classification Search
CPC .... H03H 9/02157; H03H 9/131; H03H 9/132; H03H 9/173
See application file for complete search history.

(56) References Cited

U.S. PATENT DOCUMENTS

| | | | |
|---|---|---|---|
| 2004/0257171 A1 | 12/2004 | Park et al. | 333/133 |
| 2005/0253670 A1* | 11/2005 | Song | H03H 3/02 333/187 |
| 2006/0270090 A1* | 11/2006 | Bradley | H03H 9/02149 438/48 |
| 2007/0252476 A1* | 11/2007 | Iwaki | H03H 9/02118 310/320 |
| 2007/0279154 A1* | 12/2007 | Taniguchi | H03H 9/02118 333/187 |
| 2008/0143215 A1* | 6/2008 | Hara | H03H 9/174 310/365 |
| 2010/0148637 A1 | 6/2010 | Satou | 310/367 |
| 2012/0200199 A1* | 8/2012 | Taniguchi | H03H 9/706 310/348 |
| 2017/0033769 A1* | 2/2017 | Yokoyama | H03H 9/02118 |
| 2017/0230031 A1* | 8/2017 | Yokoyama | H03H 9/54 |
| 2017/0271741 A1* | 9/2017 | Nishihara | H01P 5/16 |
| 2017/0338798 A1* | 11/2017 | Sakashita | H03H 9/568 |
| 2018/0006631 A1* | 1/2018 | Kida | H03H 9/205 |
| 2018/0041189 A1* | 2/2018 | Lee | H03H 9/54 |
| 2018/0062609 A1* | 3/2018 | Yagami | H03H 9/02015 |
| 2018/0145635 A1* | 5/2018 | Ishikawa | H03F 3/72 |
| 2018/0159508 A1* | 6/2018 | Irieda | H03H 9/587 |
| 2018/0175275 A1* | 6/2018 | Nishihara | H03H 9/587 |
| 2018/0219528 A1* | 8/2018 | Liu | H03H 9/131 |
| 2018/0294794 A1* | 10/2018 | Liu | H03H 9/175 |
| 2018/0375489 A1* | 12/2018 | Tanaka | H03H 9/173 |
| 2019/0007029 A1* | 1/2019 | Ishida | H03H 9/02118 |
| 2019/0115901 A1* | 4/2019 | Takahashi | H03H 9/02015 |
| 2019/0326873 A1* | 10/2019 | Bradley | H03H 9/0211 |
| 2020/0169245 A1* | 5/2020 | Matsuda | H03H 9/02118 |

FOREIGN PATENT DOCUMENTS

| | | |
|---|---|---|
| JP | 2003-168953 A | 6/2003 |
| JP | 2004-320784 A | 11/2004 |
| JP | 2007-281846 A | 10/2007 |
| JP | 2008-306280 A | 12/2008 |
| JP | 2009-290366 A | 12/2009 |
| JP | 2013-46110 A | 3/2013 |
| JP | 2018-125696 A | 8/2018 |

OTHER PUBLICATIONS

Lee et al., "Growth of highly c-axis textured AIN films on Mo electrodes for film bulk acoustic wave resonators," JVST (Year: 2003).*

Notice of Reasons for Refusal dated Nov. 22, 2022, issued by the Japanese Patent Office in corresponding application 2018-245827.

* cited by examiner $\alpha a < \alpha b$ $\alpha a, \alpha b < \alpha c$

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2018-245827, filed on Dec. 27, 2018, the entire contents of which are incorporated herein by reference.

FIELD

A certain aspect of the present invention relates to an acoustic wave device, a filter, and a multiplexer.

BACKGROUND

Acoustic wave devices including piezoelectric thin film resonators have been used as filters and multiplexers for wireless devices such as, for example, mobile phones. The piezoelectric thin film resonator has a structure in which a lower electrode and an upper electrode face each other across a piezoelectric film as disclosed in Japanese Patent Application Publication No. 2007-281846 (hereinafter, referred to as Patent Document 1). The region where the lower electrode and the upper electrode face each other across the piezoelectric film is a resonance region. An air gap is provided under the lower electrode within the resonance region so as not to limit the vibration in the resonance region.

To release heat generated in the resonance region, it is known to provide a heat release portion that is in contact with the substrate and the lower electrode in the center of the air gap as disclosed in, for example, Patent Document 1. It is known to form a radiator by expanding the upper electrode to the periphery of the resonance region as disclosed in Japanese Patent Application Publication No. 2003-168953 (hereinafter, referred to as Patent Document 2).

SUMMARY OF THE INVENTION

According to a first aspect of the present invention, there is provided an acoustic wave device including: a substrate; a lower electrode, an air gap being interposed between the lower electrode and the substrate; a piezoelectric film located on the lower electrode; and an upper electrode located on the piezoelectric film such that a resonance region where at least a part of the piezoelectric film is interposed between the upper electrode and the lower electrode is formed and the resonance region overlaps with the air gap in plan view, wherein a surface facing the substrate across the air gap of the lower electrode in a center region of the resonance region is positioned lower than a surface closer to the piezoelectric film of the substrate in an outside of the air gap in plan view.

According to a second aspect of the present invention, there is provided an acoustic wave device including: a substrate; a lower electrode, an air gap being interposed between the lower electrode and the substrate, a residual stress of the lower electrode being a tensile stress; a piezoelectric film located on the lower electrode; and an upper electrode located on the piezoelectric film such that a resonance region where at least a part of the piezoelectric film is interposed between the upper electrode and the lower electrode is formed and the resonance region overlaps with the air gap in plan view, a residual stress of the upper electrode being a compression stress.

According to a third aspect of the present invention, there is provided an acoustic wave device including: a substrate; a lower electrode, an air gap being interposed between the lower electrode and the substrate; a piezoelectric film located on the lower electrode; and an upper electrode located on the piezoelectric film such that a resonance region where at least a part of the piezoelectric film is interposed between the upper electrode and the lower electrode is formed and the resonance region overlaps with the air gap in plan view, wherein the lower electrode is bent outside the resonance region and inside the air gap such that the lower electrode in the resonance region is located closer to a bottom surface of the air gap than the lower electrode located outside a part, which is bent, of the lower electrode is, and as temperatures of the lower electrode, the piezoelectric film, and the upper electrode in the resonance region become greater than a temperature of the substrate, the lower electrode curves such that the lower electrode in the resonance region protrudes toward the air gap.

According to a fourth aspect of the present invention, there is provided a filter including any one of the above acoustic wave devices.

According to a fifth aspect of the present invention, there is provided a multiplexer including the above filter.

DETAILED DESCRIPTION

When a heat release portion or a radiator is provided as disclosed in Patent Documents 1 and 2, the heat release portion or the radiator suppresses vibration in the resonance region. However, when no heat release portion and no radiator are provided, the temperature in the resonance region increases.

Hereinafter, embodiments will be described with reference to the accompanying drawings.

First Embodiment

Figure 1A:
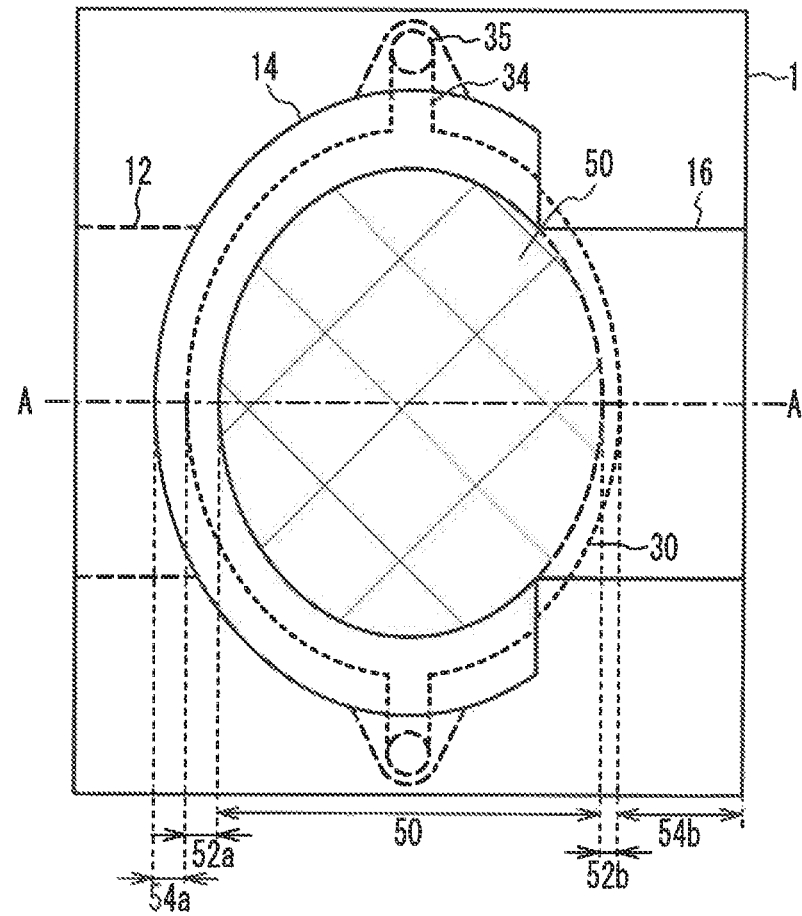
FIG. 1A is a plan view of an acoustic wave device in accordance with a first embodiment.
Figure 1B:
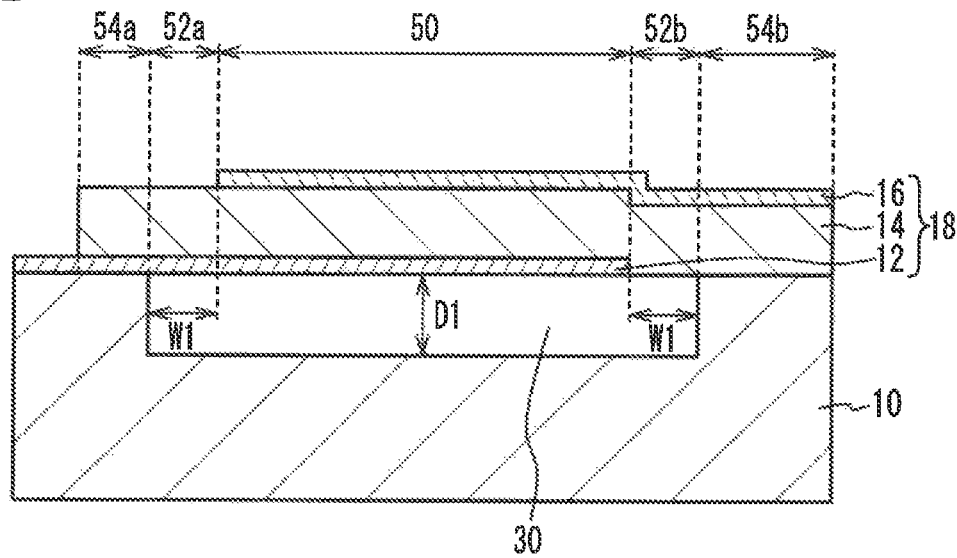
FIG. 1B is a cross-sectional view taken along line A-A before thermal deformation in FIG. 1A.

FIG. 1A is a plan view of an acoustic wave device in accordance with a first embodiment, and FIG. 1B is a cross-sectional view taken along line A-A before thermal deformation in FIG. 1A. FIG. 1B is a cross-sectional view before a high-frequency signal with large electric power is applied (before thermal deformation). As illustrated in FIG. 1A and FIG. 1B, the upper surface of a substrate 10 has a recessed portion, and the recessed portion forms an air gap 30. A lower electrode 12 is located on the air gap 30. A piezoelectric film 14 is located on the lower electrode 12. An upper electrode 16 is located on the piezoelectric film 14. A multilayered film 18 includes the lower electrode 12, the piezoelectric film 14, and the upper electrode 16.

The region where the lower electrode 12 and the upper electrode 16 face each other across at least a part of the piezoelectric film 14 is a resonance region 50. In the multilayered film 18 in the resonance region 50, the thickness longitudinal vibration resonates. The planar shape of the resonance region 50 is elliptical. In plan view, the air gap 30 is larger than the resonance region 50, and the outer edge of the air gap 30 is located further out than the outer edge of the resonance region 50. Regions between the outer edge of the resonance region 50 and the outer edge of the air gap 30 are outer peripheral regions 52a and 52b. The width of each of the outer peripheral regions 52a and 52b is represented by W1. The outer peripheral region 52a is an outer peripheral region in the region where the lower electrode 12 is extracted from the resonance region 50, and the outer peripheral region 52b is an outer peripheral region in the region where the upper electrode 16 is extracted from the resonance region 50.

In the region where the lower electrode 12 is extracted from the resonance region 50, the lower electrode 12 and the piezoelectric film 14 overlap. In the region where the upper electrode 16 is extracted from the resonance region 50, the upper electrode 16 and the piezoelectric film 14 overlap. The end face of the piezoelectric film 14 is located further out than the outer edge of the air gap 30. Regions located further out than the outer edge of the air gap 30 and provided with the piezoelectric film 14 are support regions 54a and 54b. In the support regions 54a and 54b, the piezoelectric film 14 is supported by the substrate 10. The support region 54a is a support region in the region where the lower electrode 12 is extracted from the resonance region 50, and the support region 54b is a support region in the region where the upper electrode 16 is extracted from the resonance region 50.

When a high-frequency signal with large electric power is not applied between the lower electrode 12 and the upper electrode 16 and the temperatures of the multilayered film 18 and the substrate 10 in the resonance region 50 are substantially equal, the lower surface of the lower electrode 12 is substantially flat. In this state, the distance between the lower surface of the lower electrode 12 (i.e., the lower surface of the multilayered film 18) and the upper surface of the substrate 10 under the air gap 30 is D1.

The lower electrode 12 has hole portions 35. The hole portions 35 are communicated with the air gap 30 through an introduction path 34 under the lower electrode 12. The hole portions 35 and the introduction path 34 are used to introduce an etching liquid to a sacrifice layer when the sacrifice layer used when forming the air gap 30 is etched.

The substrate 10 is, for example, an insulating substrate such as a silicon substrate, a sapphire substrate, a spinel substrate, an alumina substrate, a quartz substrate, a glass substrate, a ceramic substrate, or a GaAs substrate, or a semiconductor substrate. The lower electrode 12 and the upper electrode 16 are formed of a single-layer film of, for example, ruthenium (Ru), chrome (Cr), aluminum (Al), titanium (Ti), copper (Cu), molybdenum (Mo), tungsten (W), tantalum (Ta), platinum (Pt), rhodium (Rh) or iridium (Ir), or a multilayered film in which at least two of them are stacked.

The piezoelectric film 14 may be made of zinc oxide (ZnO), lead zirconate titanate (PZT), or lead titanate (Pb-TiO$_3$) instead of aluminum nitride (AlN). In addition, for example, the piezoelectric film 14 may be mainly composed of aluminum nitride, and may contain other elements for improving the resonance characteristics or the piezoelectricity. For example, use of scandium (Sc), a Group II element and a Group IV element, or a Group II element and a Group V element as additive elements improves the piezoelectricity of the piezoelectric film 14. Thus, the effective electromechanical coupling coefficient of the piezoelectric thin film resonator is improved. The Group II element is, for example, calcium (Ca), magnesium (Mg), strontium (Sr), or zinc (Zn). The Group IV element is, for example, titanium, zirconium (Zr) or hafnium (Hf). The Group V element is, for example, tantalum, niobium (Nb), or vanadium (V). Furthermore, the piezoelectric film 14 may be mainly composed of aluminum nitride, and contain boron (B). The names of the groups of the elements are as per description in the International Union of Pure and Applied Chemistry (IUPAC).

The exemplary materials and dimensions of the piezoelectric thin film resonator having a resonant frequency of approximately 2.5 GHz are as follows. The substrate 10 is a silicon substrate. The lower electrode 12 is formed of a ruthenium film with a film thickness of 198 nm. The piezoelectric film 14 is an aluminum nitride film having a film thickness of 981 nm and having the (0001) direction as a main axis. The upper electrode 16 is formed of a ruthenium film with a film thickness of 217 nm. The major axis of the resonance region 50 has a length of 157 µm, and the minor axis of the resonance region 50 has a length of 112 µm. D1 is 0.5 µm, and W1 is 1 µm. The materials and the dimensions are appropriately set to obtain desired resonance characteristics.

Figure 2A:
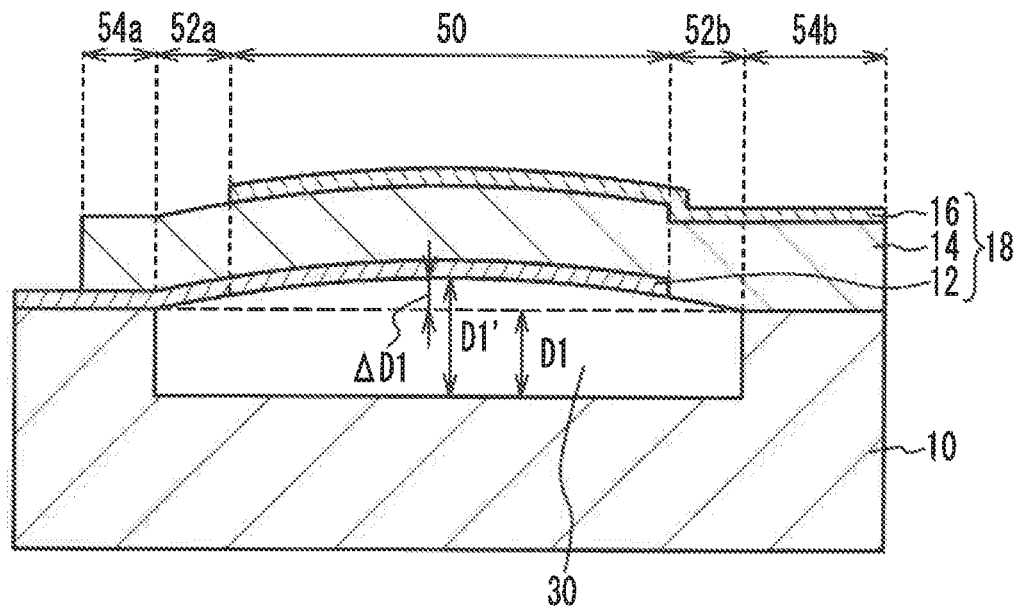
FIG. 2A and FIG. 2B are cross-sectional views of acoustic wave devices in accordance with a first comparative example and the first embodiment after thermal deformation, respectively.
Figure 2B:
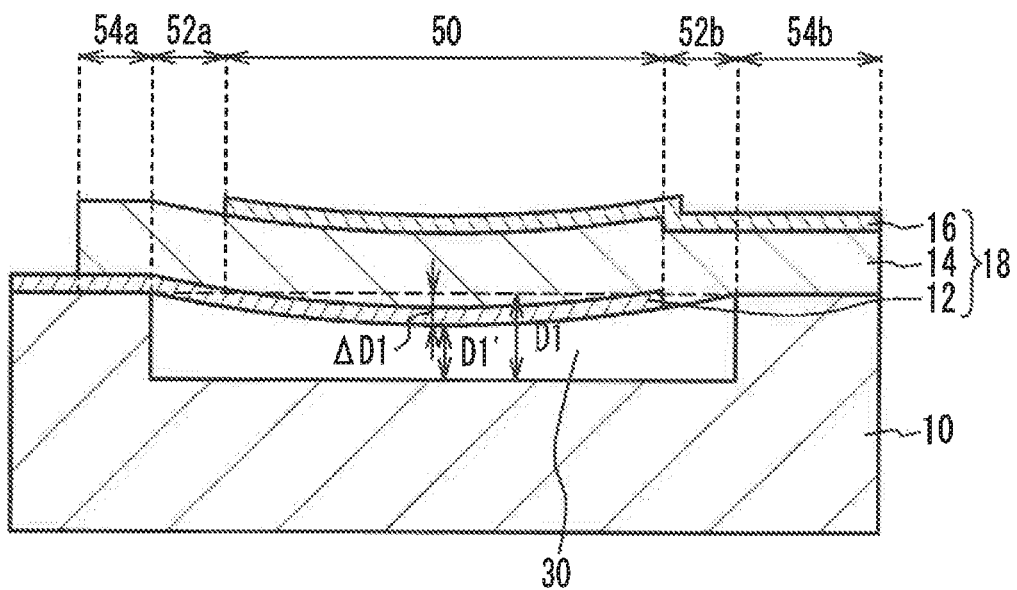

FIG. 2A and FIG. 2B are cross-sectional views of acoustic wave devices in accordance with a first comparative example and the first embodiment after thermal deformation. As illustrated in FIG. 2A, when a high-frequency signal with large electric power is applied between the lower electrode 12 and the upper electrode 16, the multilayered film 18 generates heat in the resonance region 50, resulting in increase in the temperature of the multilayered film 18. On the other hand, the temperature of the substrate 10 increases very little. Thus, the multilayered film 18 is likely to extend in the planar direction. In the first comparative example, the multilayered film 18 bulges upward. This is because the lower surfaces of the lower electrode 12 and the piezoelectric film 14 are supported by the substrate 10 in the support region 54a and the support region 54b, and the multilayered film 18 is positioned higher than the support surfaces in the support regions 54a and 54b.

Near the center of the resonance region 50, the distance D1' between the lower electrode 12 and the substrate 10 becomes greater than the distance D1 obtained when the temperatures of the multilayered film 18 and the substrate 10 are substantially equal by ΔD1. Accordingly, the amount of heat released from the lower electrode 12 in the resonance region 50 to the substrate 10 through the air gap 30 decreases, and the temperature of the multilayered film 18 in the resonance region 50 increases. Thus, ΔD1 further increases, and the temperature of the multilayered film 18 in the resonance region 50 further increases. As described above, in the first comparative example, the temperature of the multilayered film 18 in the resonance region increases.

As illustrated in FIG. 2B, in the first embodiment, when the multilayered film 18 generates heat in the resonance region 50, the multilayered film 18 bulges downward. Near the center of the resonance region 50, the distance D1' between the lower electrode 12 and the substrate 10 becomes less than the distance D1 by ΔD1. Thus, the flow of heat conducts from the lower electrode 12 in the resonance region 50 to the substrate 10 by radiation and/or the convection of gas in the air gap 30. Compared with the first comparative example, the amount of heat released from the multilayered film 18 to the substrate 10 is large, and the increase in the temperature of the multilayered film 18 in the resonance region 50 is reduced.

Specific structures for causing the multilayered film 18 in the resonance region 50 to bulge downward by heat generation will be described in variations described hereinafter.

First Variation of the First Embodiment

Figure 3A:
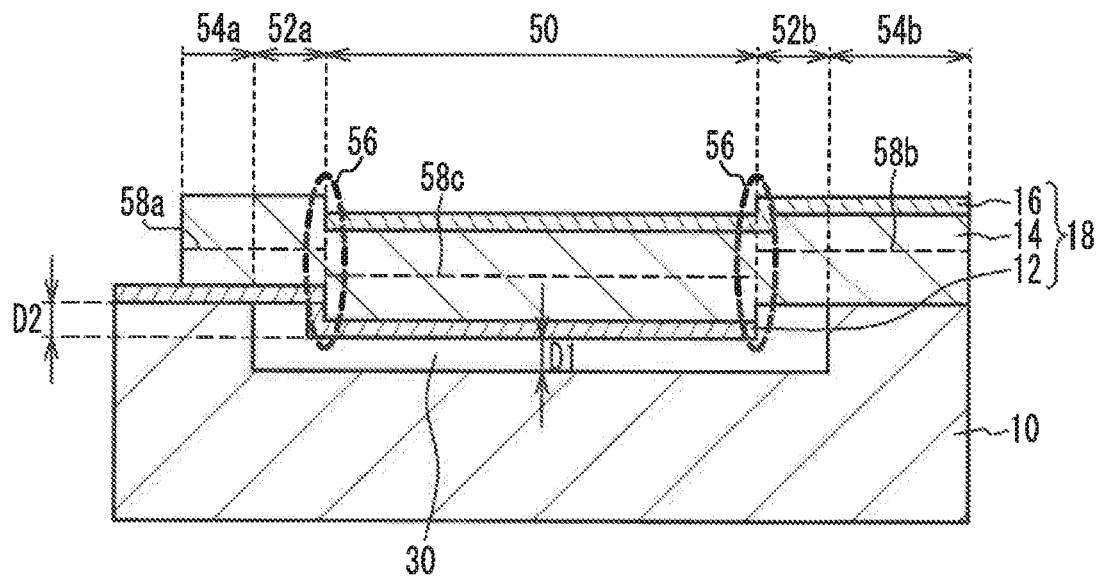
FIG. 3A and FIG. 3B are cross-sectional views of an acoustic wave device in accordance with a first variation of the first embodiment before and after thermal deformation, respectively.
Figure 3B:
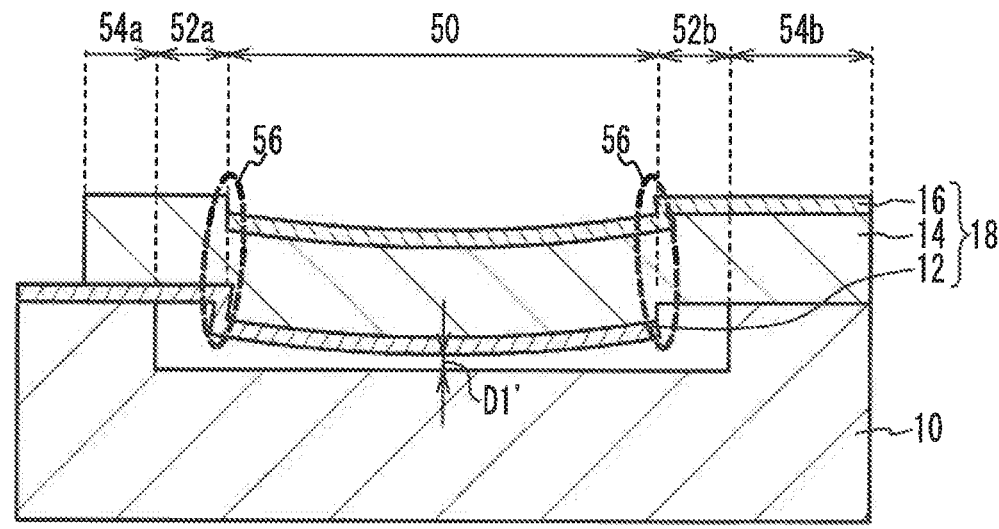

FIG. 3A and FIG. 3B are cross-sectional views of an acoustic wave device in accordance with a first variation of the first embodiment before and after thermal deformation, respectively. FIG. 3A is a cross-sectional view before thermal deformation (for example, before a high-frequency signal with large electric power is applied), and FIG. 3B is a cross-sectional view after thermal deformation (for example, after a high-frequency signal with large electric power is applied).

As illustrated in FIG. 3A, in bend parts 56 in the outer peripheral regions 52a and 52b, the multilayered film 18 is bent downward. Thus, the lower surface of the lower electrode 12 in the center part of the resonance region 50 is positioned lower than the lower surface of the multilayered film 18 in the support regions 54a and 54b. The distance between the lower surface of the lower electrode 12 in the resonance region 50 and the lower surface of the multilayered film 18 in the support regions 54a and 54b is represented by D2. The distance between the lower surface of the lower electrode 12 and the upper surface of the substrate 10 in the resonance region 50 is represented by D1. The center line in the stacking direction of the multilayered film 18 in the outer peripheral region 52a and the support region 54a is defined as a center line 58a, and the center line in the stacking direction of the multilayered film 18 in the outer peripheral region 52b and the support region 54b is defined as a center line 58b. The center line in the stacking direction of the multilayered film 18 in the resonance region 50 is defined as a center line 58c.

As illustrated in FIG. 3B, when a high-frequency signal with large electric power is applied between the lower electrode 12 and the upper electrode 16, the multilayered film 18 in the resonance region 50 generates heat, and the multilayered film 18 expands in the planar direction. Since the multilayered film 18 is supported by the substrate 10 in the support regions 54a and 54b, the multilayered film 18 receives the counteracting force of the thermal expansion force from the substrate 10 in the support regions 54a and 54b. Since the bend parts 56 are located in the outer peripheral regions 52a and 52b, the multilayered film 18 bulges downward. Thus, the distance between the lower surface of the lower electrode 12 and the upper surface of the substrate 10 in the resonance region 50 becomes D1' less than D1.

Figure 4:
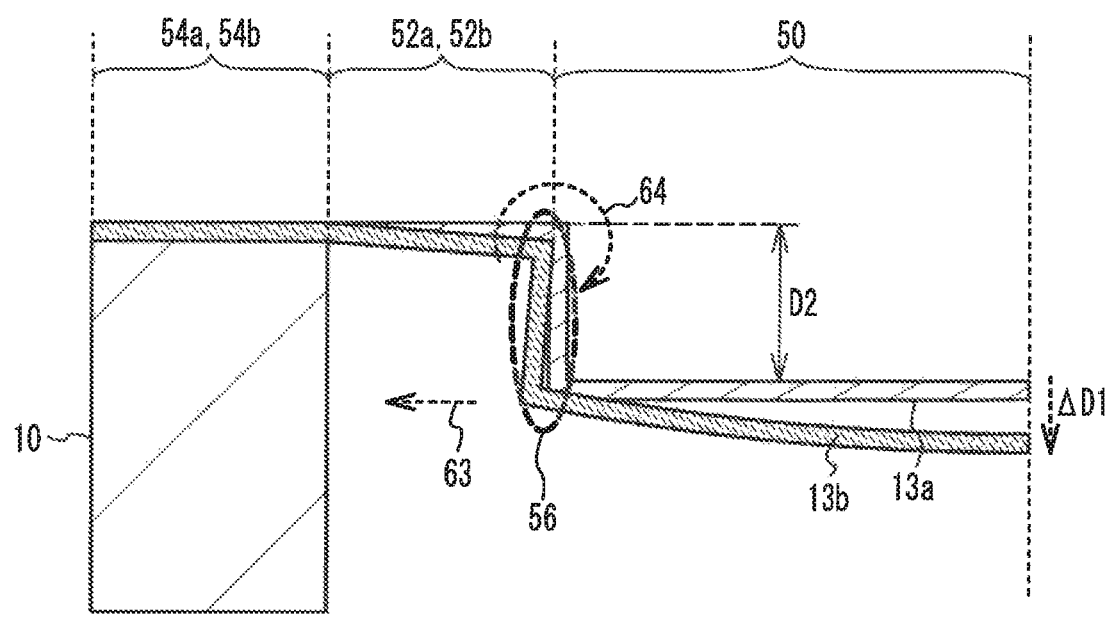
FIG. 4 illustrates thermal deformation in the first variation of the first embodiment by a leaf spring model.

FIG. 4 illustrates thermal deformation in the first variation of the first embodiment with use of a leaf spring model. As illustrated in FIG. 4, the multilayered film 18 before thermal deformation is expressed by a leaf spring 13a, and the multilayered film 18 after thermal deformation is expressed by a leaf spring 13b. Before thermal deformation, the leaf spring 13a is bent like a crank in the bend part 56, and the leaf spring 13a in the resonance region 50 is positioned lower than the leaf spring 13a in the outer peripheral regions 52a and 52b by the distance D2.

The temperature of the leaf spring 13a in the resonance region 50 increases, and the leaf spring 13a expands in the planar direction as indicated by an arrow 63. The leaf spring 13a is supported by the upper surface of the substrate 10 in the support regions 54a and 54b. The leaf spring 13b expanding in the resonance region 50 and the leaf spring 13b in the outer peripheral regions 52a and 52b are located in different positions in the vertical direction. Thus, a torque indicated by an arrow 64 is generated in the top end of the bend part 56. As a result, the leaf spring 13b in the resonance region 50 stably bulges downward.

As described above, to generate a torque indicated by the arrow 64, it is important that the leaf spring 13a in the resonance region 50 is positioned lower than the leaf spring 13a in the outer peripheral regions 52a and 52b. When this is applied to FIG. 3A, the center line 58c of the resonance region 50 is positioned lower than the center lines 58a and 58b of the outer peripheral regions 52a and 52b. In the outer peripheral region 52a, the multilayered film 18 is formed of the lower electrode 12 and the piezoelectric film 14. In the outer peripheral region 52b, the multilayered film 18 is formed of the piezoelectric film 14 and the upper electrode 16. Thus, the condition for the center line 58c to be positioned lower than the center lines 58a and 58b is that the distance D2 is greater than a half of the thickness of one of the lower electrode 12 and the upper electrode 16 that is thicker. To cause the multilayered film 18 to reliably bulge downward, the distance D2 is preferably equal to or greater than one time, more preferably equal to or greater than two times the thickness of one of the lower electrode 12 and the upper electrode 16 that is thicker. The distance D2 is preferably less than the thickness of the multilayered film 18.

Manufacturing Method of the First Variation of the First Embodiment

Figure 5A:
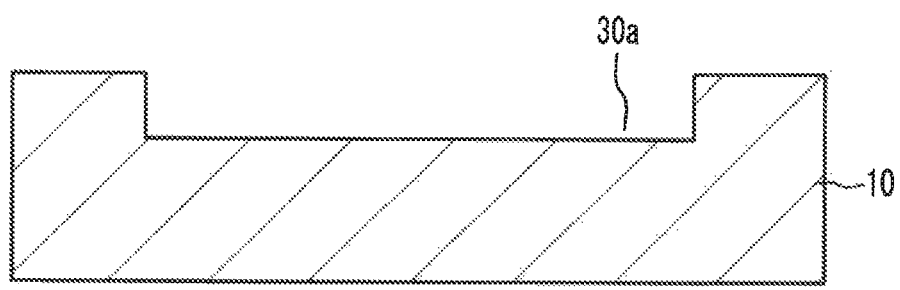
FIG. 5A through FIG. 5D are cross-sectional views (No. 1) illustrating a method of manufacturing the acoustic wave device in accordance with the first variation of the first embodiment.

FIG. 5A through FIG. 6C are cross-sectional views illustrating a method of manufacturing the acoustic wave device in accordance with the first variation of the first embodiment. As illustrated in FIG. 5A, a recessed portion 30a is formed in the upper surface of the substrate 10 by photolithography and etching.

Figure 5B:
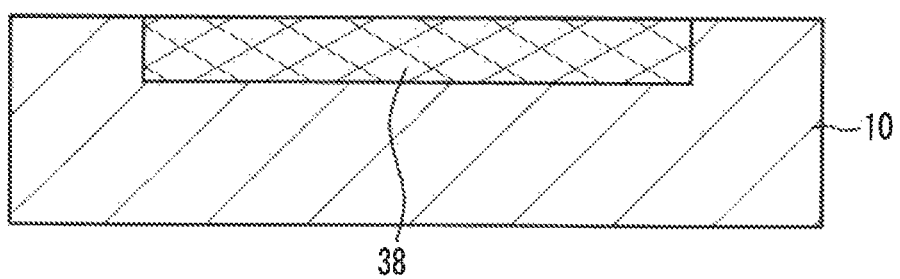

As illustrated in FIG. 5B, a sacrifice layer 38 is formed on the substrate 10 and in the recessed portion 30a by sputtering, vacuum evaporation, or chemical vapor deposition (CVD). The material for the sacrifice layer 38 is selected from, for example, magnesium oxide (MgO), zinc oxide (ZnO), germanium (Ge), or silicon oxide ($SiO_2$) that easily dissolves in an etching liquid or an etching gas. The sacrifice layer 38 formed on the substrate 10 is removed except the sacrifice layer 38 formed in the recessed portion 30a. The sacrifice layer 38 is removed by, for example, liftoff or chemical mechanical polishing (CMP).

Figure 5C:
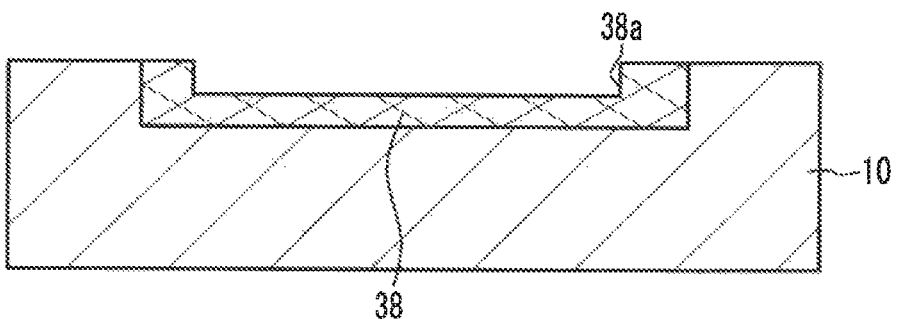
Figure 5D:
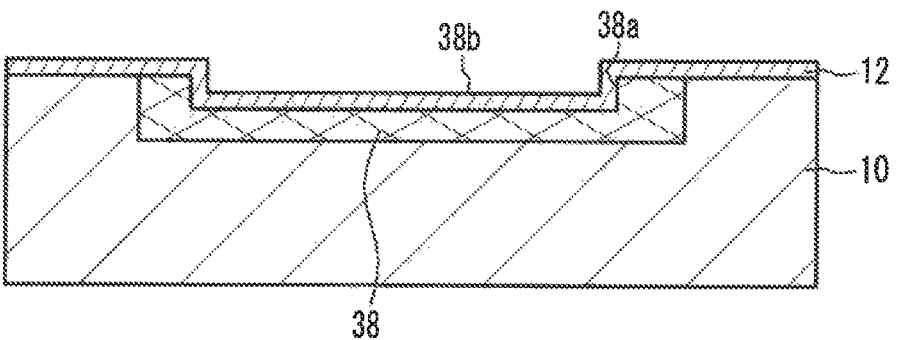

As illustrated in FIG. 5C, a recessed portion 38a is formed in the upper surface of the sacrifice layer 38 by photolithography and etching. As illustrated in FIG. 5D, the lower electrode 12 is formed on the substrate 10 and the sacrifice layer 38 by sputtering, vacuum evaporation method, or CVD. The lower electrode 12 is formed on the bottom surface and the side surface of the recessed portion 38a. Accordingly, a recessed portion 38b having a shape substantially identical to the shape of the recessed portion 38a is formed on the upper surface of the lower electrode 12.

Figure 6A:
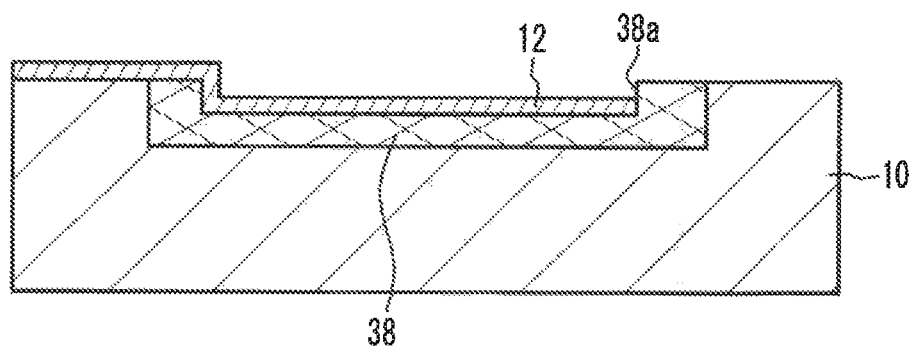
FIG. 6A through FIG. 6C are cross-sectional views (No. 2) illustrating the method of manufacturing the acoustic wave device in accordance with the first variation of the first embodiment.
Figure 6B:
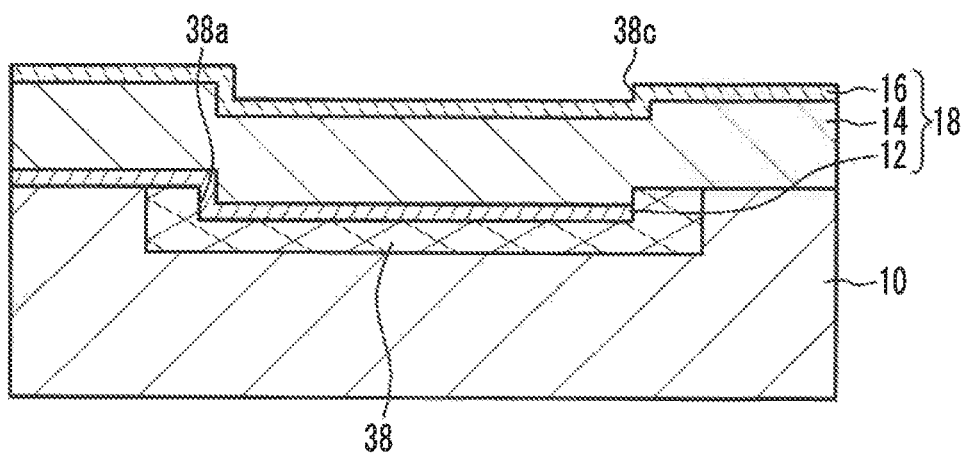

As illustrated in FIG. 6A, the lower electrode 12 is patterned into a desired shape by photolithography and etching. The lower electrode 12 remains in at least a part of the recessed portion 38a. The lower electrode 12 may be patterned by liftoff. As illustrated in FIG. 6B, the piezoelectric film 14 and the upper electrode 16 are formed on the lower electrode 12 and the substrate 10 by sputtering, vacuum evaporation, or CVD. A recessed portion 38c having a shape substantially identical to the shape of the recessed portion 38a is formed on the piezoelectric film 14 and the upper surface of the upper electrode 16.

Figure 6C:
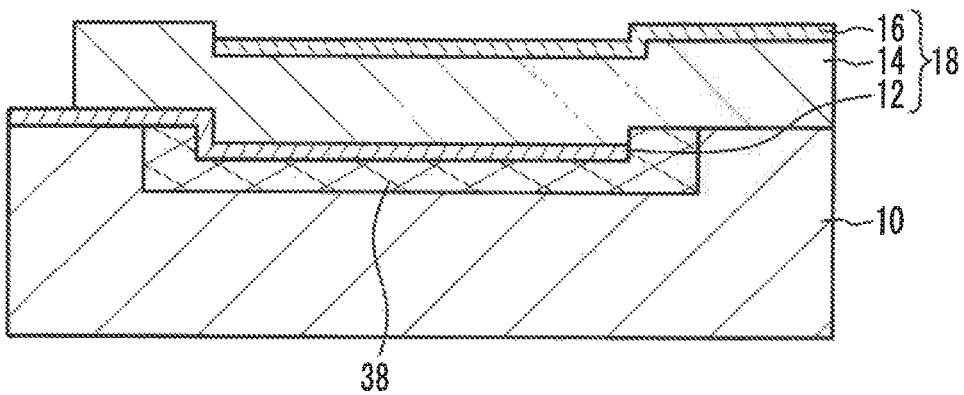

As illustrated in FIG. 6C, the lower electrode 12 is patterned into a desired shape by photolithography and etching. The upper electrode 16 remains in at least a part of the recessed portion 38c. The upper electrode 16 may be patterned by liftoff. The piezoelectric film 14 is patterned into a desired shape by photolithography and etching. Thereafter, an etching liquid is introduced into the sacrifice layer 38 under the lower electrode 12 through the hole portions 35 and the introduction path 34. This process removes the sacrifice layer 38. Through the above processes, the piezoelectric thin film resonator illustrated in FIG. 3A is completed.

Second Variation of the First Embodiment

Figure 7A:
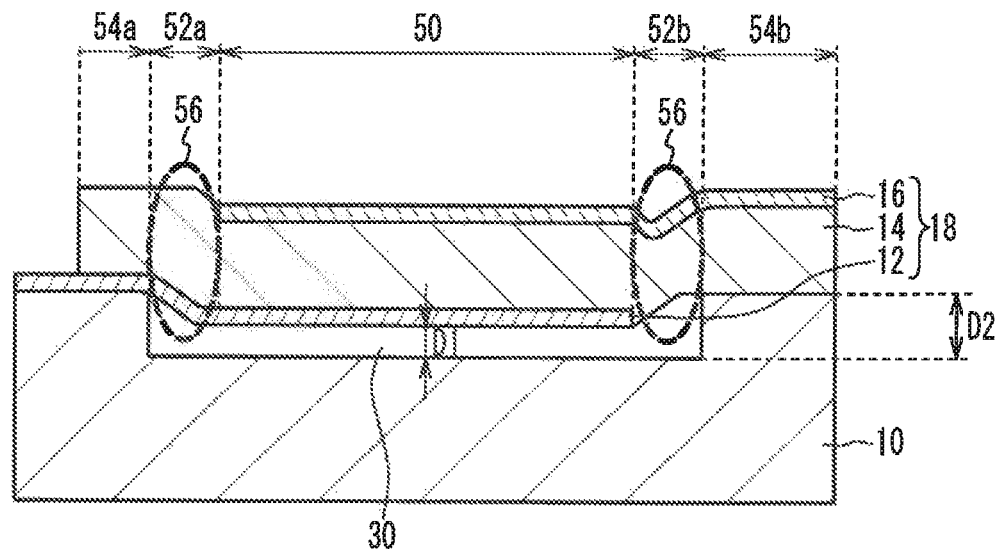
FIG. 7A and FIG. 7B are cross-sectional views of an acoustic wave device in accordance with a second variation of the first embodiment before and after thermal deformation, respectively.
Figure 7B:
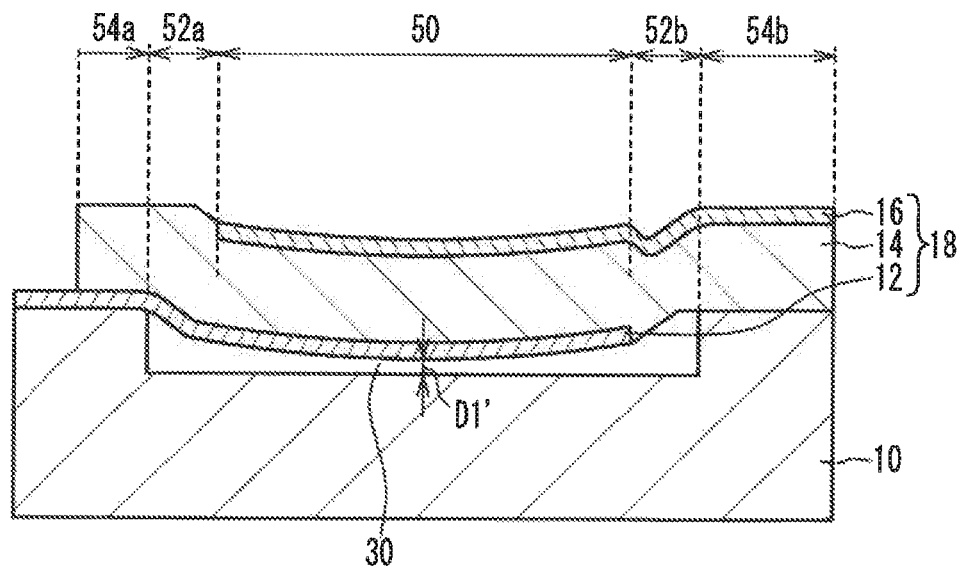

FIG. 7A and FIG. 7B are cross-sectional views illustrating an acoustic wave device in accordance with a second variation of the first embodiment before and after thermal deformation, respectively. FIG. 7A is a cross-sectional view before thermal deformation, and FIG. 7B is a cross-sectional view after thermal deformation. As illustrated in FIG. 7A, in the bend parts 56 before thermal deformation, the lower surface of the multilayered film 18 is gently bent from the outer edge to the inner edge of the outer peripheral regions 52a and 52b. As illustrated in FIG. 7B, after thermal deformation, the distance D1' is shorter than the distance D1. As in the second variation of the first embodiment, the lower surface of the multilayered film 18 may be gently bent in the bend parts 56. This structure reduces stress concentration on the multilayered film 18 at the time of thermal deformation. Thus, formation of cracks in the multilayered film 18 is inhibited. Other structures are the same as those of the first variation of the first embodiment, and the description thereof is thus omitted.

Third Variation of the First Embodiment

Figure 8:
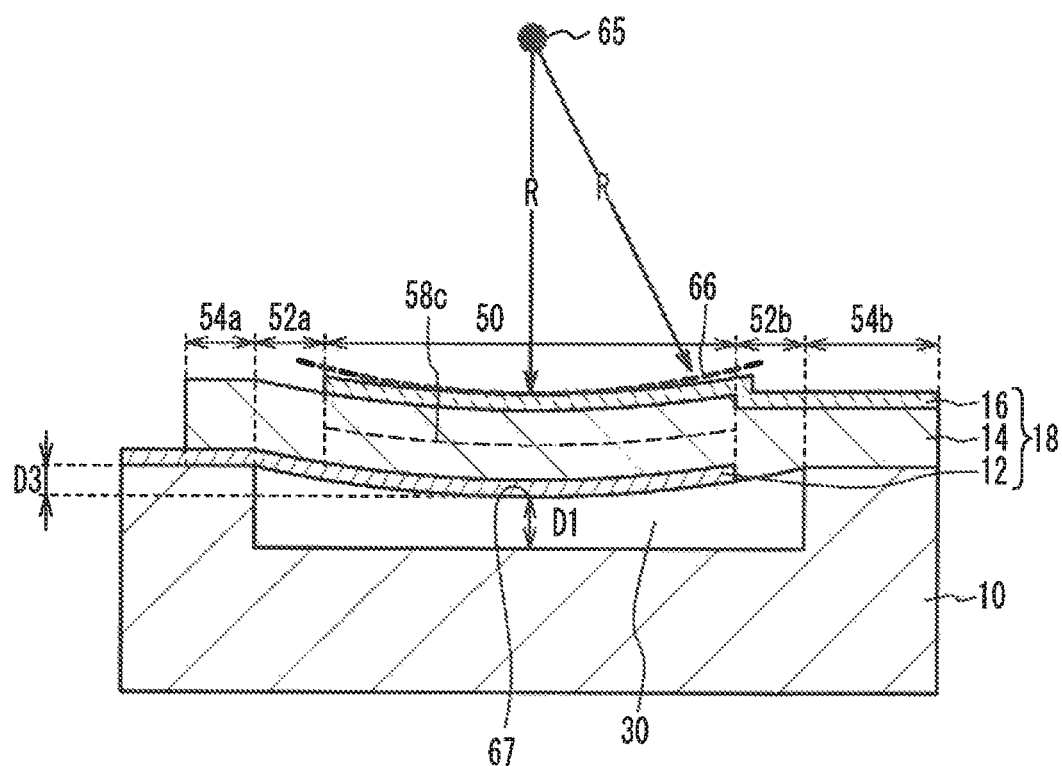
FIG. 8 is a cross-sectional view of an acoustic wave device in accordance with a third variation of the first embodiment before thermal deformation.

FIG. 8 is a cross-sectional view of an acoustic wave device in accordance with a third variation of the first embodiment before thermal deformation. As illustrated in FIG. 8, in the resonance region 50, the lower surface of the multilayered film 18 gently bulges downward. The upper surface of the multilayered film 18 is a part of a spherical surface 66 of a sphere with a radius R having a center 65 above the center of the resonance region 50. The center line 58c of the multilayered film 18 is a part of the spherical surface obtained by shifting the spherical surface 66 in the stacking direction. The distance between a point 67, which is the lowest point of the lower surface of the lower electrode 12, and the upper surface of the substrate 10 is D1. The distance between the point 67 and the lower surface of the multilayered film 18 in the support regions 54a and 54b is D3.

When the multilayered film 18 in the resonance region 50 generates heat, and the multilayered film 18 expands, the multilayered film 18 elongates in the direction of the center line 58c. Thus, the multilayered film 18 bulges downward. To cause the multilayered film 18 to bulge downward, the distance D3 is preferably greater than a half of the thickness of one of the lower electrode 12 and the upper electrode 16 that is thicker, more preferably equal to or greater than one time the thickness of one of the lower electrode 12 and the upper electrode 16 that is thicker, further preferably equal to or greater than two times the thickness of one of the lower electrode 12 and the upper electrode 16 that is thicker. The distance D3 is preferably smaller than the thickness of the multilayered film 18. Other configurations are the same as those of the first variation of the first embodiment, and the description thereof is thus omitted.

As in the first through third variations of the first embodiment, the multilayered film 18 in the resonance region 50 may be formed so as to bulge downward when the bend parts 56 are provided in the outer peripheral regions 52a and 52b.

Manufacturing Method of the Third Variation of the First Embodiment

Figure 9A:
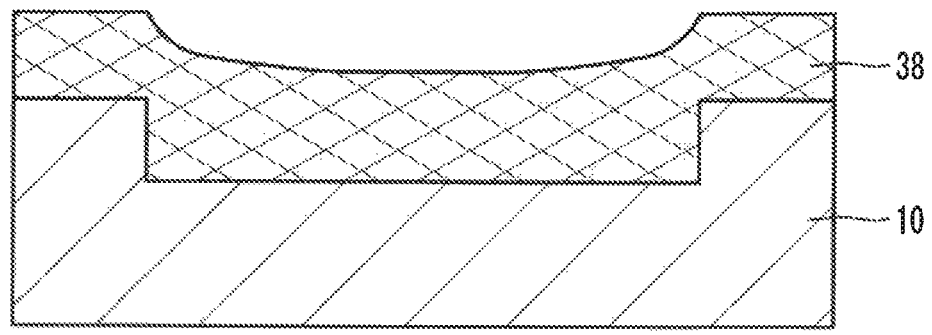
FIG. 9A and FIG. 9B are cross-sectional views illustrating a method of manufacturing the acoustic wave device in accordance with the third variation of the first embodiment.
Figure 9B:
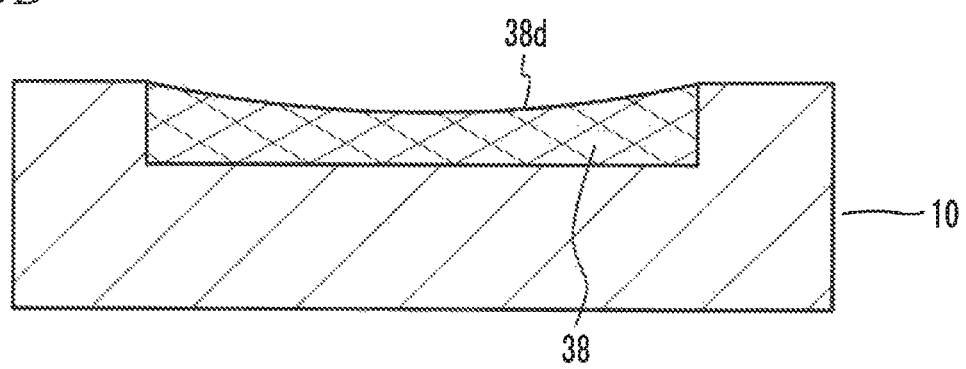

FIG. 9A and FIG. 9B are cross-sectional views illustrating a method of manufacturing the acoustic wave device in accordance with the third variation of the first embodiment. As illustrated in FIG. 9A, after FIG. 5A, the sacrifice layer 38 is formed in the recessed portion 30a and on the substrate 10. The sacrifice layer 38 is also formed on the substrate 10 in addition to the substrate 10 in the recessed portion 30a. The upper surface of the sacrifice layer 38 on the recessed portion 30a is positioned higher than the upper surface of the substrate 10 other than the recessed portion 30a. A level difference along the recessed portion 30a is formed on the upper surface of the sacrifice layer 38.

As illustrated in FIG. 9B, the upper surface of the sacrifice layer 38 is planarized by CMP. When a material such as magnesium oxide that has lower elasticity than and is brittler than the substrate 10 is used as the sacrifice layer 38, so-called dishing forms a curved recessed portion 38d having a small curvature of which the center portion of the recessed portion 30a is deep and the periphery is shallow in the upper surface of the sacrifice layer 38. Thereafter, execution of the steps in and after FIG. 5C completes the piezoelectric thin film resonator in FIG. 8.

Fourth Variation of the First Embodiment

Figure 10A:
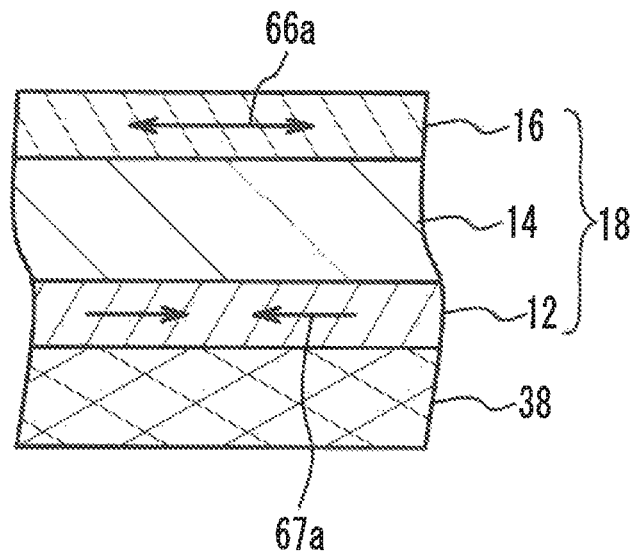
FIG. 10A and FIG. 10B are schematic views of a multilayered film in a fourth variation of the first embodiment.
Figure 10B:
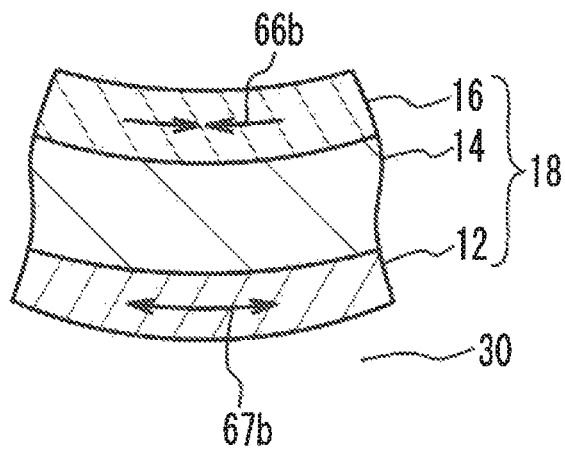

A fourth variation of the first embodiment controls the stress of the multilayered film 18. FIG. 10A and FIG. 10B are schematic views of a multilayered film in the fourth variation of the first embodiment. As illustrated in FIG. 10A, in the state where the multilayered film 18 is stacked on the sacrifice layer 38, a stress 67a in the direction in which the lower electrode 12a is compressed is applied to the lower electrode 12, and a stress 66a in the direction in which the upper electrode 16 extends is applied to the upper electrode 16. That is, the inner stress of the lower electrode 12 is a tensile stress, and the inner stress of the upper electrode 16 is a compression stress. For example, when the lower electrode 12 and the upper electrode 16 are formed by sputtering, the magnitudes and the directions of the inner stresses of the lower electrode 12 and the upper electrode 16 are desirably set by adjusting conditions such as a film formation temperature, a gas pressure, and bias. The inner stresses of the lower electrode 12 and the upper electrode 16 are, for example, the residual stresses of the lower electrode 12 and the upper electrode 16.

As illustrated in FIG. 10B, when the sacrifice layer 38 is removed, and the air gap 30 is thereby formed under the multilayered film 18, the multilayered film 18 can be freely deformed. At this time, a tensile strain 67b is applied to the lower electrode 12, and a compression strain 66b is applied to the upper electrode 16. Thus, the multilayered film 18 bulges downward. Accordingly, the structure of the third variation of the first embodiment is achieved. Also in the first and second variations of the first embodiment, the multilayered film 18 bulges downward by configuring the lower electrode 12 to have a compression stress and configuring the upper electrode 16 to have a tensile stress. Thus, this configuration can cause the multilayered film 18 to reliably bulge downward after thermal deformation.

The absolute values of the stresses of the lower electrode 12 and the upper electrode 16 at room temperature are preferably 10 MPa or greater, more preferably 20 MPa or greater, further preferably 50 MPa or greater.

Fifth Variation of the First Embodiment

Figure 11A:
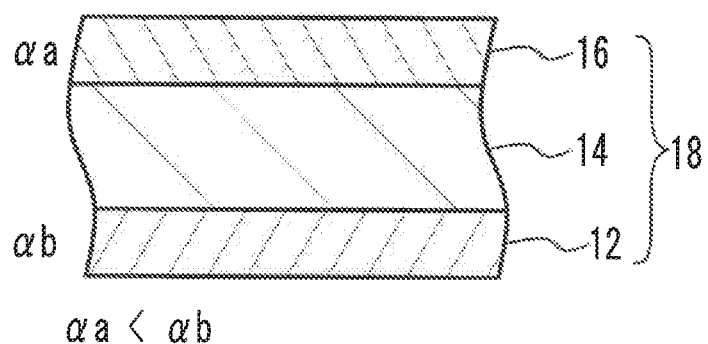
FIG. 11A and FIG. 11B are schematic views of the multilayered film in a fifth variation of the first embodiment before and after thermal deformation, respectively.
Figure 11B:
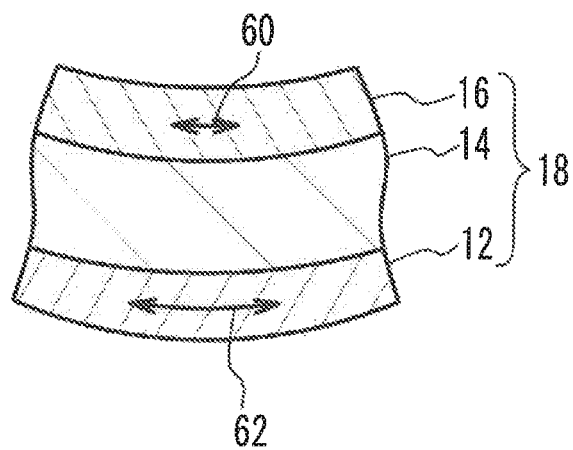

In a fifth variation of the first embodiment, the linear expansion coefficients of the lower electrode 12 and the upper electrode 16 are made to be different. FIG. 11A and FIG. 11B are schematic views of the multilayered film in the fifth variation of the first embodiment before and after thermal deformation, respectively. As illustrated in FIG. 11A, the linear expansion coefficient αb of the lower electrode 12 is configured to be greater than the linear expansion coefficient αa of the upper electrode 16.

As illustrated in FIG. 11B, as the temperature of the multilayered film 18 increases, the degree of extension of the lower electrode 12 indicated by an arrow 62 is greater than the degree of extension of the upper electrode 16 indicated by an arrow 60. Thus, the multilayered film 18 is deformed so as to bulge downward. Accordingly, this configuration can cause the multilayered film 18 to reliably bulge downward after thermal deformation.

Table 1 lists the linear expansion coefficients of metals used for the lower electrode and the upper electrode.

TABLE 1

| Material | Linear expansion coefficient [×10$^{-6}$/° C.] |
|---|---|
| Ruthenium (Ru) | 6.4 |
| Aluminum (Al) | 23.9 |
| Copper (Cu) | 16.5 |
| Molybdenum (Mo) | 4.9 |
| Tungsten (W) | 4.5 |
| Tantalum (Ta) | 6.3 |
| Platinum (Pt) | 8.9 |
| Rhodium (Rh) | 8.2 |
| Iridium (Ir) | 6.5 |

Table 1 lists the linear expansion coefficients of ruthenium, aluminum, copper, molybdenum, tungsten, tantalum, platinum, rhodium, and iridium. For example, the linear expansion coefficient of tungsten is smaller than the linear expansion coefficient of ruthenium. Thus, the lower electrode 12 is formed of a ruthenium film, and the upper electrode 16 is formed of a tungsten film. This configuration causes the multilayered film 18 to bulge downward as the temperature of the multilayered film 18 increases as illustrated in FIG. 11B. The materials for the lower electrode 12 and the upper electrode 16 can be appropriately set in consideration of the linear expansion coefficient and the acoustic impedance.

The linear expansion coefficient of the lower electrode 12 is preferably equal to or greater than 1.1 times, more preferably equal to or greater than 1.2 times, further preferably equal to or greater than 1.5 times the linear expansion coefficient of the upper electrode 16.

Sixth Variation of the First Embodiment

Figure 12A:
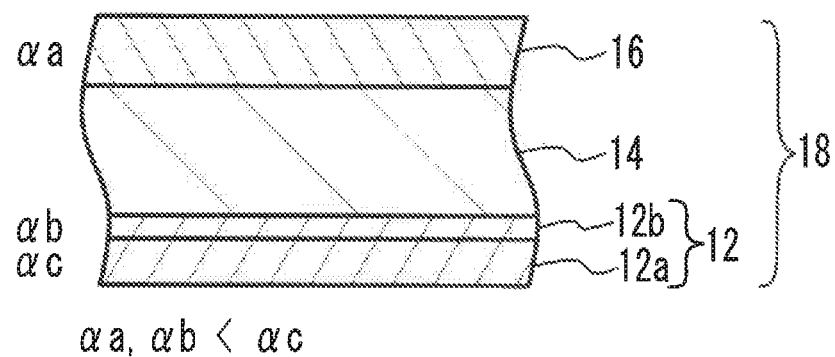
FIG. 12A and FIG. 12B are schematic views of the multilayered film in a sixth variation of the first embodiment before and after thermal deformation, respectively.
Figure 12B:
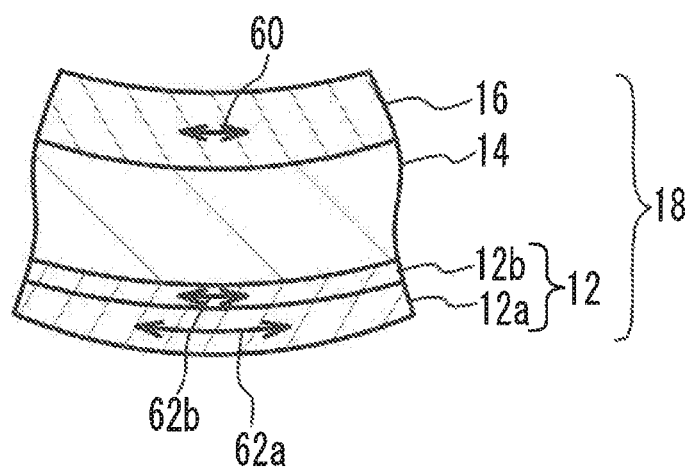

A sixth variation of the first embodiment describes a case where the lower electrode 12 includes a plurality of layers having different linear expansion coefficients. FIG. 12A and FIG. 12B are schematic views of the multilayered film in the sixth variation of the first embodiment before and after thermal deformation, respectively. As illustrated in FIG. 12A, the lower electrode 12 includes a lower electrode 12a and a lower electrode 12b located on the lower electrode 12a. The linear expansion coefficient αc of the lower electrode 12a is greater than the linear expansion coefficients αa and αb of the lower electrode 12b and the upper electrode 16.

As illustrated in FIG. 12B, as the temperature of the multilayered film 18 increases, the growth of the lower electrode 12a indicated by an arrow 62a is greater than the growth of the lower electrode 12b indicated by an arrow 62b and the growth of the upper electrode 16 indicated by the arrow 60. Thus, the multilayered film 18 is deformed so as to bulge downward. Thus, this configuration can cause the multilayered film 18 to more reliably bulge downward after thermal deformation.

As presented in Table 1, aluminum has a large linear expansion coefficient. However, aluminum has small acoustic impedance. Thus, when the lower electrode 12 is made of aluminum, the characteristics of the piezoelectric thin film resonator degrades. Thus, the upper electrode 16 and the lower electrode 12b that are in contact with the piezoelectric film 14 are made of ruthenium or molybdenum having large acoustic impedance. The lower electrode 12a is made of aluminum. This configuration reduces deterioration in characteristics, and allows the multilayered film 18 to more reliably bulge downward after thermal deformation.

The linear expansion coefficient of the lower electrode 12a is preferably equal to or greater than 1.2 times, more preferably equal to or greater than 1.5 times, further preferably equal to or greater than 2 times the linear expansion coefficients of the lower electrode 12b and the upper electrode 16.

In the first embodiment and the first through fourth variations thereof, as in the fifth and sixth variations of the first embodiment, the linear expansion coefficient of a metal layer that forms at least a part of the lower electrode 12 may be greater than the linear expansion coefficient of the upper electrode 16.

Seventh Variation of the First Embodiment

Figure 13A:
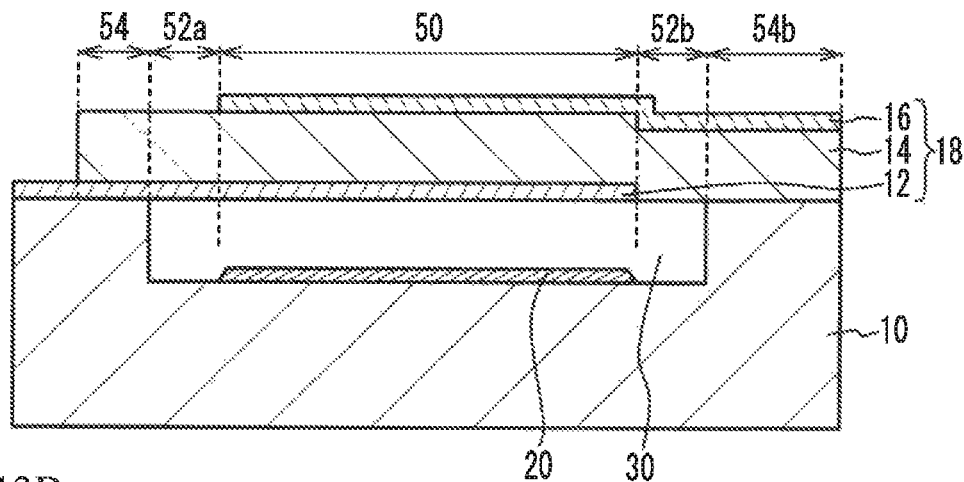
FIG. 13A through FIG. 13C are cross-sectional views of an acoustic wave device in accordance with a seventh variation of the first embodiment.
Figure 13B:
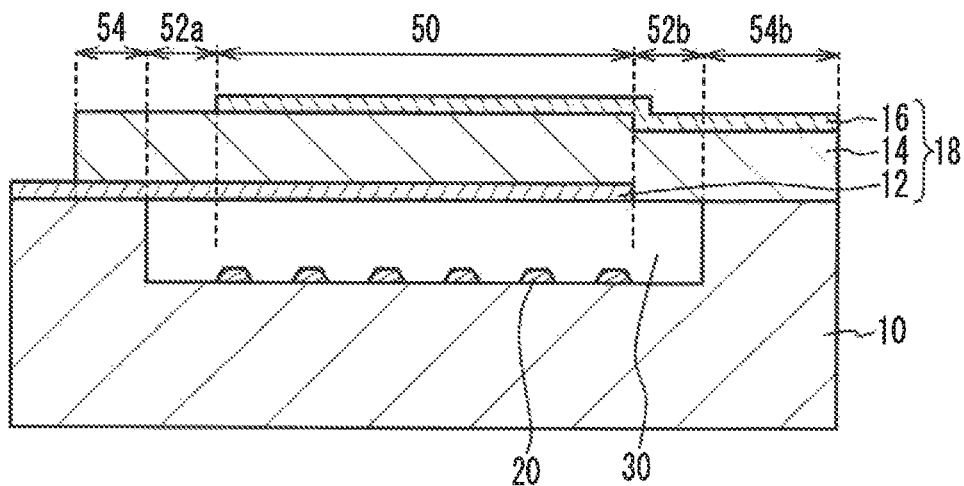
Figure 13C:
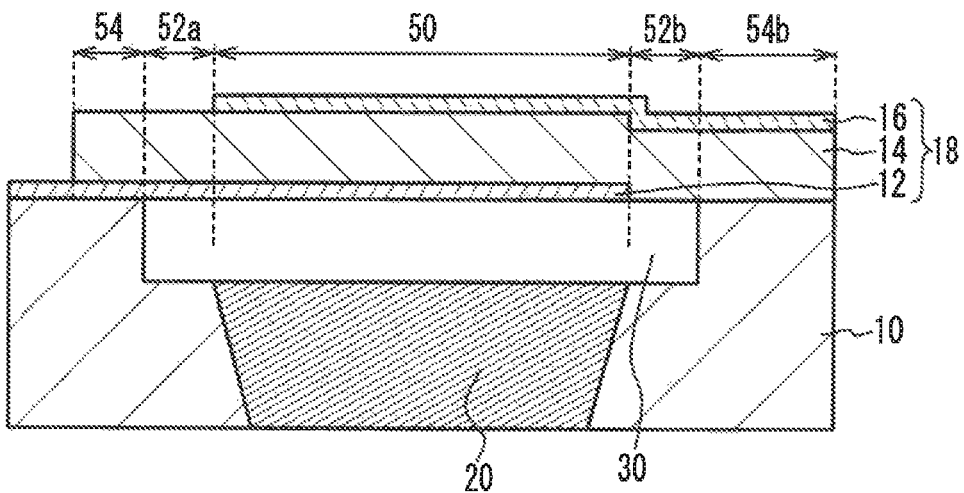

FIG. 13A through FIG. 13C are cross-sectional views of an acoustic wave device in accordance with a seventh variation of the first embodiment. As illustrated in FIG. 13A, one metal film 20 is located on the upper surface of the substrate 10 that is the bottom surface of the air gap 30. As illustrated in FIG. 13B, the metal films 20 are located on the upper surface of the substrate 10 that is the bottom surface of the air gap 30. As illustrated in FIG. 13C, the metal film 20 is provided as a via penetrating through the substrate 10.

In the seventh variation of the first embodiment, the thermal flow of the multilayered film 18 quickly diffuses because of the metal film 20. Thus, the heat release performance is further improved. The thermal conductivity of the metal film 20 is preferably greater than the thermal conductivity of the substrate 10.

Table 2 lists the thermal conductivities of the materials used for the substrate 10 and the metal film 20.

TABLE 2

| Material | Thermal conductivity [W/m · K] |
|---|---|
| Silicon | 168 |
| Glass | 1 |
| Sapphire | 42 |
| Ruthenium (Ru) | 117 |
| Aluminum (Al) | 236 |
| Copper (Cu) | 398 |
| Molybdenum (Mo) | 138 |
| Tungsten (W) | 173 |
| Tantalum (Ta) | 57.5 |
| Platinum (Pt) | 70 |
| Rhodium (Rh) | 150 |
| Iridium (Ir) | 147 |

Table 2 lists the thermal conductivities of silicon, glass, and sapphire as the material used for the substrate 10, and the thermal conductivities of the materials identical to the materials listed in Table 1 as the material used for the metal film 20. Silicon has a high thermal conductivity. Thus, when silicon is used for the substrate 10, a metal having a large thermal conductivity such as aluminum or copper is preferably used for the metal film 20. When glass or sapphire is used for the substrate 10, any metal listed in Table 2 has a thermal conductivity greater than the thermal conductivity of the substrate 10. Thus, ruthenium or molybdenum, which is often used for the lower electrode 12 and the upper electrode 16, may be used as the metal film 20.

To improve the heat release performance, the thickness of the metal film 20 is preferably equal to or greater than, for example, 100 nm. The metal film 20 preferably penetrates through the substrate 10 as illustrated in FIG. 13C. In addition, as illustrated in FIG. 13B, when the metal films 20 are provided in an island pattern, the sacrifice layer 38 is inhibited from remaining on the upper surface of the substrate 10 at the time of wet-etching the sacrifice layer 38. In the first embodiment and the first through sixth variations thereof, the metal film 20 of the seventh variation of the first embodiment may be provided.

Eighth Variation of the First Embodiment

Figure 14A:
FIG. 14A through FIG. 14C are cross-sectional views illustrating a method of manufacturing an acoustic wave device in accordance with an eighth variation of the first embodiment.
Figure 14B:
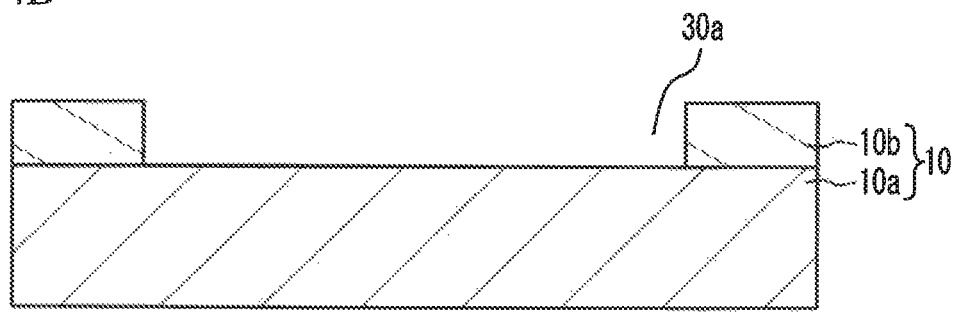
Figure 14C:
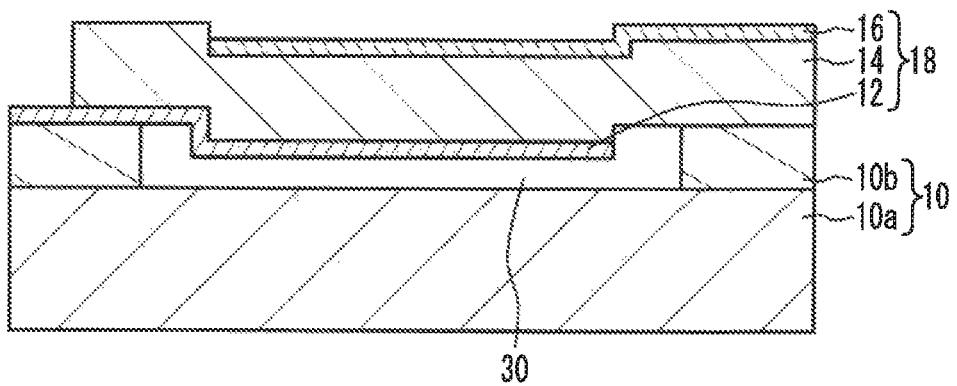

FIG. 14A through FIG. 14C are cross-sectional views illustrating a method of manufacturing an acoustic wave device in accordance with an eighth variation of the first embodiment. As illustrated in FIG. 14A, a support layer 10b is formed on a substrate 10a. The substrate 10a and the support layer 10b form the substrate 10. The substrate 10a is, for example, a silicon substrate, a sapphire substrate, a spinel substrate, an alumina substrate, a quartz substrate, a glass substrate, a ceramic substrate, or a GaAs substrate. The support layer 10b is a metal layer, an insulating layer, or a piezoelectric layer. The support layer 10b is formed by, for example, sputtering, vacuum evaporation, or CVD. The support layer 10b may be made of the same material as the lower electrode 12, the piezoelectric film 14, the upper electrode 16, the insertion film 28, and the sacrifice layer 38.

As illustrated in FIG. 14B, the support layer 10b is patterned into a desired shape by photolithography and etching. The support layer 10b may be patterned by liftoff. This process forms the recessed portion 30a. As illustrated in FIG. 14C, thereafter, the steps in and after FIG. 5B are carried out, and thereby, the acoustic wave device of the eighth variation of the first embodiment is formed. Other structures are the same as those of the first variation of the first embodiment, and the description thereof is thus omitted.

As in the eighth variation of the first embodiment, the substrate 10 may include the substrate 10a having a flat upper surface and the support layer 10b that forms the recessed portion 30a. In the first embodiment and the second through seventh variations thereof, the substrate 10 may include the substrate 10a and the support layer 10b.

Simulation

The deformation of the multilayered film 18 caused by heat generation of the multilayered film 18 and the temperature of the multilayered film 18 were simulated. In the simulation, increase in the temperature of the multilayered film 18 due to the heat generation of the multilayered film 18 was calculated by a thermal analysis using the finite element method. The thermal deformation of the multilayered film 18 caused by the temperature increase calculated by the thermal analysis was calculated by a structural analysis using the finite element method. The change in the temperature of the multilayered film 18 due to the thermal deformation calculated by the structural analysis was calculated by a thermal analysis again. As described above, the thermal analysis and the structural analysis were repeatedly made to calculate the temperature distribution and the structure in the equilibrium state.

Simulation for a 2.5 GHz Band

A piezoelectric thin film resonator for the 2.5 GHz band was subjected to the simulation. The structure of the simulated piezoelectric thin film resonator is as follows.

Upper electrode 16: Ruthenium film with a thickness of 188 nm

Piezoelectric film 14: Aluminum nitride film with a thickness of 981 nm
Lower electrode 12: Ruthenium film with a thickness of 156 nm
Substrate 10: Silicon substrate
Distance D1: 0.5 μm
Resonance region 50: formed in an elliptical shape having a major axis of 157 μm and a minor axis of 112 μm
Widths of the outer peripheral regions 52a and 52b: 2.1 μm The impedance at approximately 2.5 GHz is approximately 50Ω.

Table 3 lists the thermal conductivity, the linear expansion coefficient, Young's modulus, the Poisson ratio, the elastic modulus, the piezoelectric constant, and the relative permittivity of each member used in the simulation.

TABLE 3

| Material | Thermal conductivity [W/m · K] | Linear expansion coefficient [×10$^{-6}$/° C.] | Young's modulus [GPa] | Poisson ratio |
|---|---|---|---|---|
| Air | 0.024 | — | — | — |
| Ruthenium | 117 | 6.4 | 447 | 0.3 |
| Aluminum nitride | 150 | 5.27 | — | — |
| Silicon | 160 | 3.5 | 169 | 0.3 |

| Material | Elastic modulus C33 [GPa] | Piezoelectric constant e33 [C/m] | Relative permittivity |
|---|---|---|---|
| Aluminum nitride | 395 | 1.58 | 10 |

The stresses of the upper electrode 16 and the lower electrode 12 of the first embodiment and the first comparative example were assumed as follows.

First Comparative Example

Upper electrode 16: 0 MPa
Lower electrode 12: 0 MPa

First Embodiment

Figure 15A:
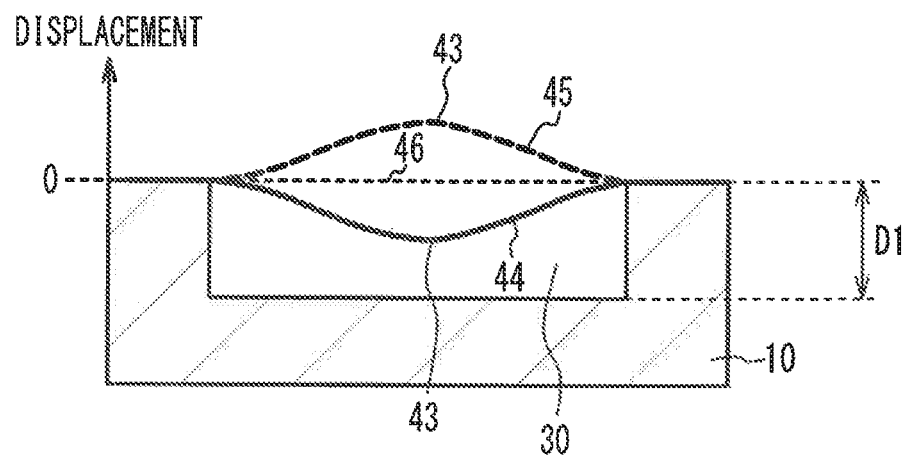
FIG. 15A illustrates the lower surface of a lower electrode in a simulation.
Figure 15B:
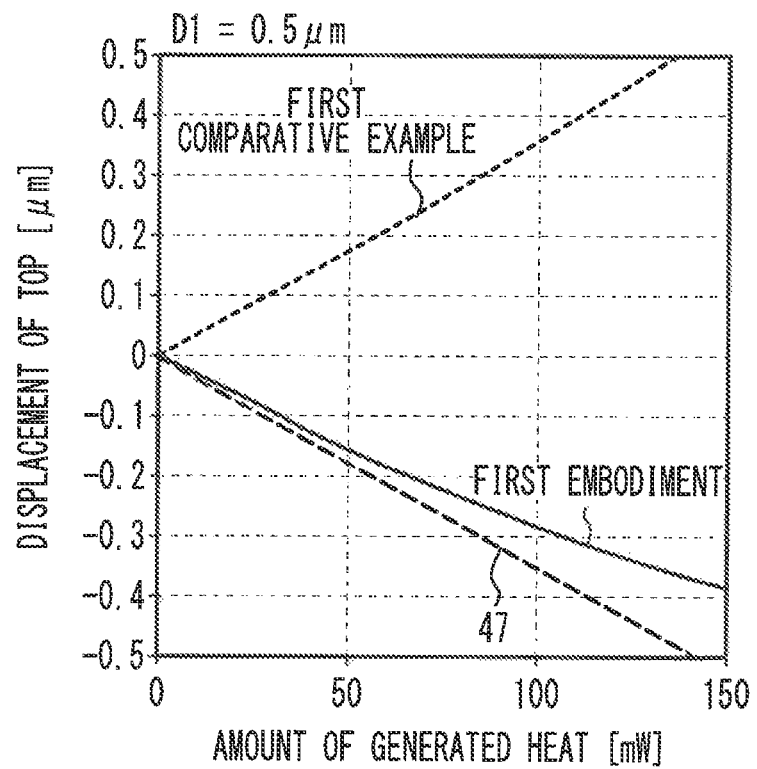
FIG. 15B is a graph of the displacement of a top versus the amount of generated heat in a 2.5 GHz band.

Upper electrode 16: Tensile stress +100 MPa
Lower electrode 12: Compression stress −100 MPa FIG. 15A illustrates the lower surface of the lower electrode in the simulation, and FIG. 15B is a graph of the displacement of a top versus the amount of generated heat in the 2.5 GHz band. As illustrated in FIG. 15A, both in the first embodiment and the first comparative example, it was assumed that the lower surface of the lower electrode 12 was flat as indicated by a straight line 46 at room temperature. When the lower surface of the lower electrode 12 is deformed downward as indicated by a solid line 44, the displacement of a top 43 is expressed by a negative value, and when the lower surface of the lower electrode 12 is deformed upward as indicated by a dashed line 45, the displacement of the top 43 is expressed by a positive value. When the displacement of the top 43 is −0.5 μm, the top 43 of the lower surface of the lower electrode 12 comes in contact with the upper surface of the substrate 10 under the air gap 30.

As illustrated in FIG. 15B, as the amount of generated heat of the multilayered film 18 increases, the displacement of the top substantially linearly increases in the positive direction in the first comparative example. In the first embodiment, the displacement of the top is negative. The reason is considered as follows. In the first embodiment, since the upper electrode 16 has a tensile stress and the lower electrode 12 has a compression stress, a torque that causes the multilayered film 18 to bulge downward when the multilayered film 18 generates heat and the multilayered film 18 expands is applied.

When the amount of generated heat is small, the displacement of the top in the first embodiment changes along a straight line 47 with respect to the amount of generated heat. As the amount of generated heat increases, the displacement of the top is shifted from the straight line 47, and the change becomes gentle. This is considered because as the top 43 becomes closer to the upper surface of the substrate 10, the amount of heat released from the multilayered film 18 to the substrate 10 increases, and thereby, the temperature of the multilayered film 18 decreases.

Figure 16A:
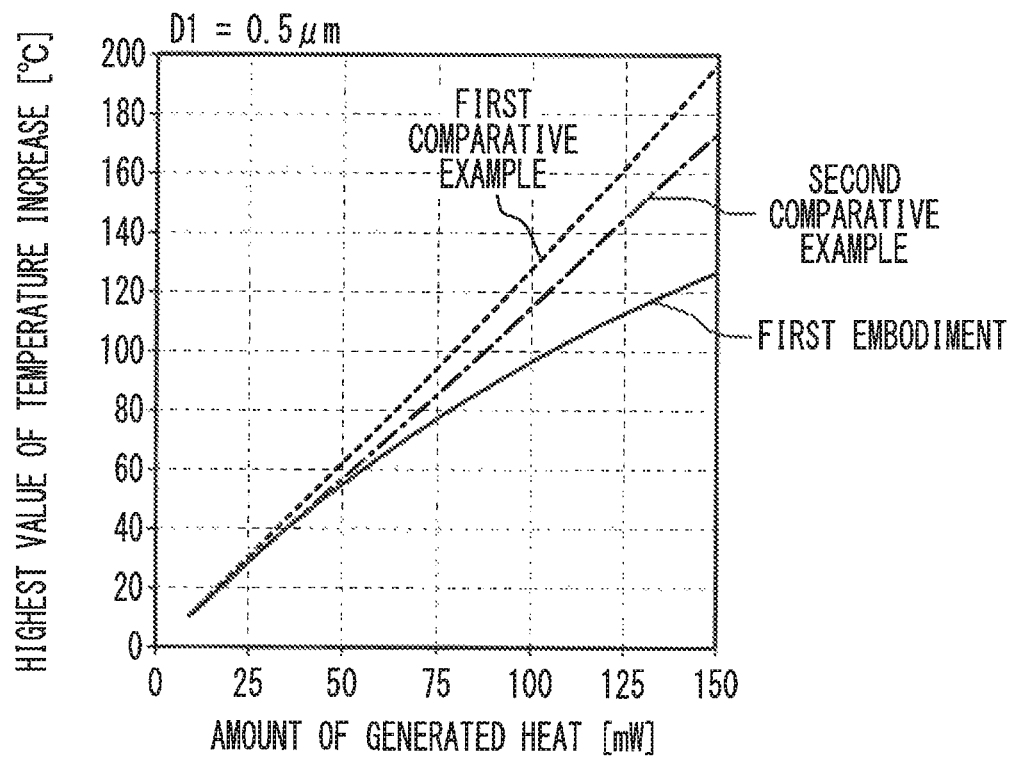
FIG. 16A and FIG. 16B are graphs of the highest value of temperature increase versus the amount of generated heat in the 2.5 GHz band.

FIG. 16A is a graph of the highest value of temperature increase versus the amount of generated heat in the 2.5 GHz band. The highest value of temperature increase is the value at the location where the increase in temperature is the greatest in the multilayered film 18 within the resonance region 50. In a second comparative example, it was assumed that even when the temperature increases, the multilayered film 18 is not deformed. As illustrated in FIG. 16A, in the first and second comparative examples and the first embodiment, as the amount of heat generated by the multilayered film 18 increases, the highest value of temperature increase in the multilayered film 18 increases. The highest value of temperature increase in the first comparative example is greater than that in the second comparative example. This is considered because the multilayered film 18 bulges upward as the multilayered film 18 generates heat as illustrated in FIG. 15B, and thereby the amount of heat released through the air gap 30 decreases. The highest value of temperature increase in the first embodiment is smaller than that in the second comparative example. This is considered because the multilayered film 18 bulges downward as the multilayered film 18 generates heat as illustrated in FIG. 15B, and thereby the amount of heat released through the air gap 30 increases.

Figure 16B:
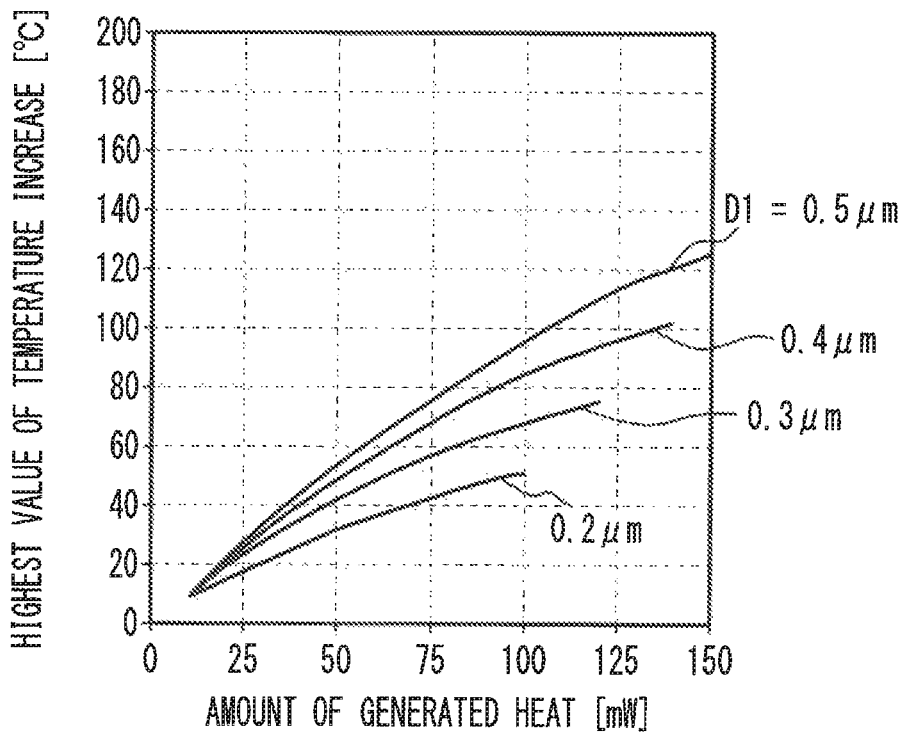

FIG. 16B is a graph of the highest value of temperature increase versus the amount of generated heat in the 2.5 GHz band. The distance D1 was set at 0.5 μm, 0.4 μm, 0.3 μm, and 0.2 μm. As illustrated in FIG. 16B, as the distance D1 decreases, the maximum temperature of the multilayered film 18 decreases. As described above, as the distance D1 is reduced, the amount of heat released from the multilayered film 18 is further increased. The right end of each curve represents that the top 43 comes in contact with the substrate 10. Immediately before the top 43 comes in contact with the substrate 10, the amount of heat released from the multilayered film 18 to the substrate 10 is large. Thus, even when the amount of generated heat increases, the rise in the maximum temperature is gentle.

Simulation for a 6.0 GHz Band

A piezoelectric thin film resonator for the 6.0 GHz band was subjected to the simulation. The structure of the simulated piezoelectric thin film resonator is as follows.

Upper electrode 16: Ruthenium film with a thickness of 78 nm
Piezoelectric film 14: Aluminum nitride film with a thickness of 409 nm
Lower electrode 12: Ruthenium film with a thickness of 65 nm
Substrate 10: Silicon substrate
Distance D1: 0.5 μm or 0.15 μm Resonance region 50: formed in an elliptical shape having a major axis of 65.5 µm and a minor axis of 46.3 µm Widths of the outer peripheral regions 52a and 52b: 0.9 µm The impedance at approximately 6.0 GHz is approximately 50Ω. Other simulation conditions are the same as those of the simulation of the piezoelectric thin film resonator for the 2.5 GHz band.

Figure 17A:
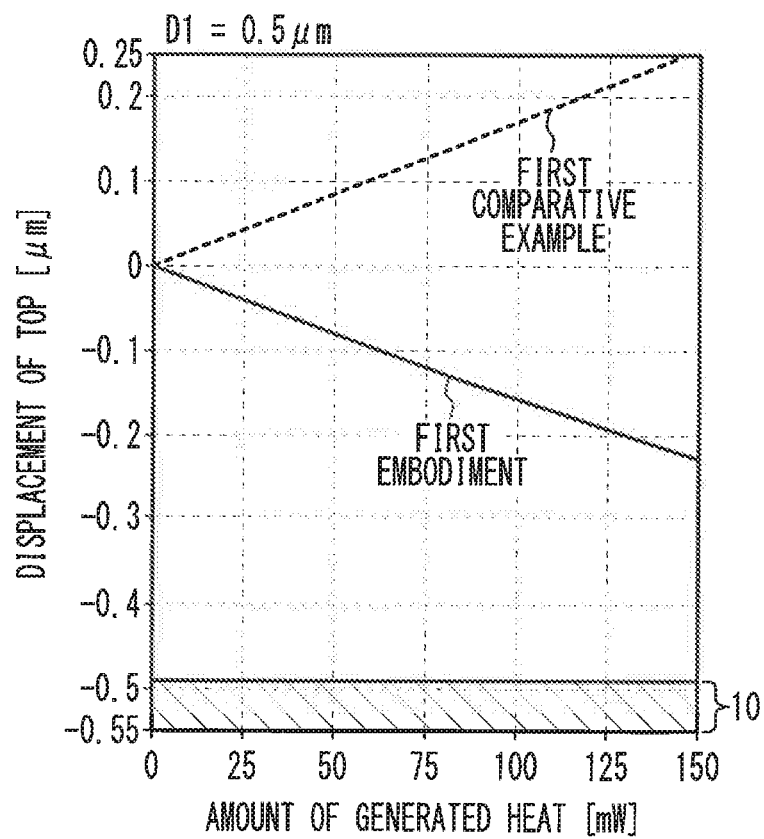
FIG. 17A is a graph of the displacement of a top versus the amount of generated heat in a 6.0 GHz band.
Figure 17B:
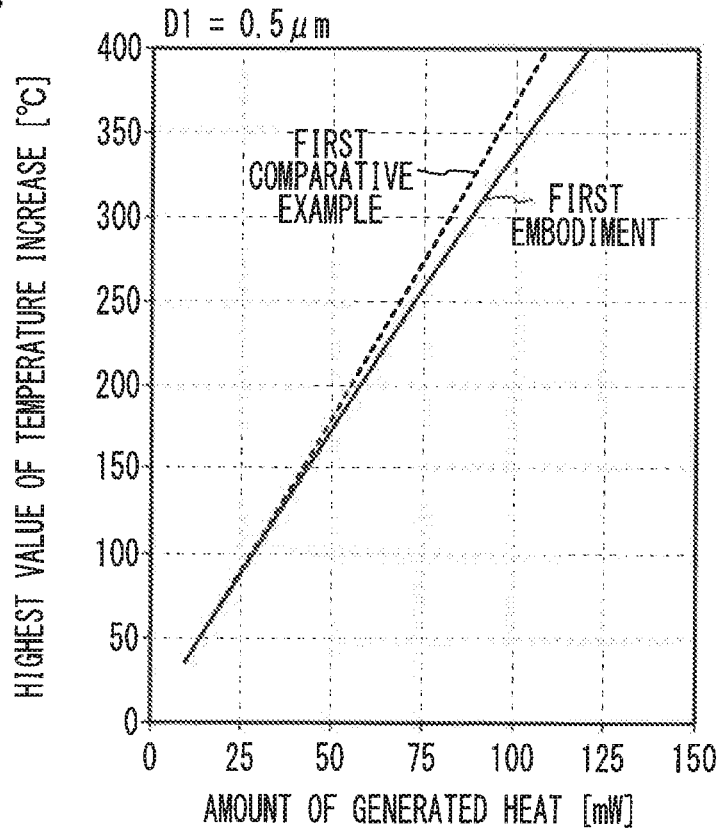
FIG. 17B is a graph of the highest value of temperature increase versus the amount of generated heat.

FIG. 17A is a graph of the displacement of a top versus the amount of generated heat in the 6.0 GHz band, and FIG. 17B is the highest value of temperature increase versus the amount of generated heat. The distance D1 is 0.5 µm. In FIG. 17A, when the displacement of the top becomes −0.5 µm or less, the top 43 comes in contact with the substrate 10. As illustrated in FIG. 17A, in the first comparative example, as the amount of generated heat increases, the multilayered film 18 bulges upward. In contrast, in the first embodiment, the multilayered film 18 bulges downward. Compared with the simulation in the 2.5 GHz band in FIG. 16A, the change in the displacement of the top is small even at the same amount of generated heat.

As illustrated in FIG. 17B, the highest value of temperature increase in the first embodiment is smaller than that in the first comparative example. However, compared with the simulation in the 2.5 GHz band in FIG. 16A, the difference between the first comparative example and the first embodiment is small. This is considered because the top 43 does not become closer to the upper surface of the substrate 10 because the resonance region 50 of the piezoelectric thin film resonator for the 6.0 GHz band is small and thereby, the displacement of the top is small.

Figure 18A:
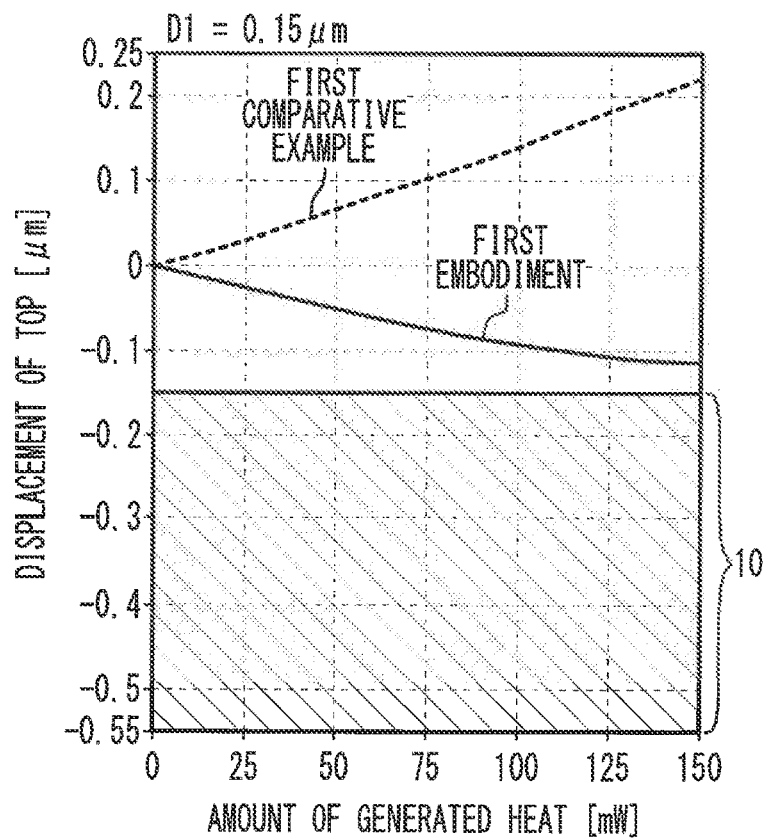
FIG. 18A is a graph of the displacement of a top versus the amount of generated heat in the 6.0 GHz band.
Figure 18B:
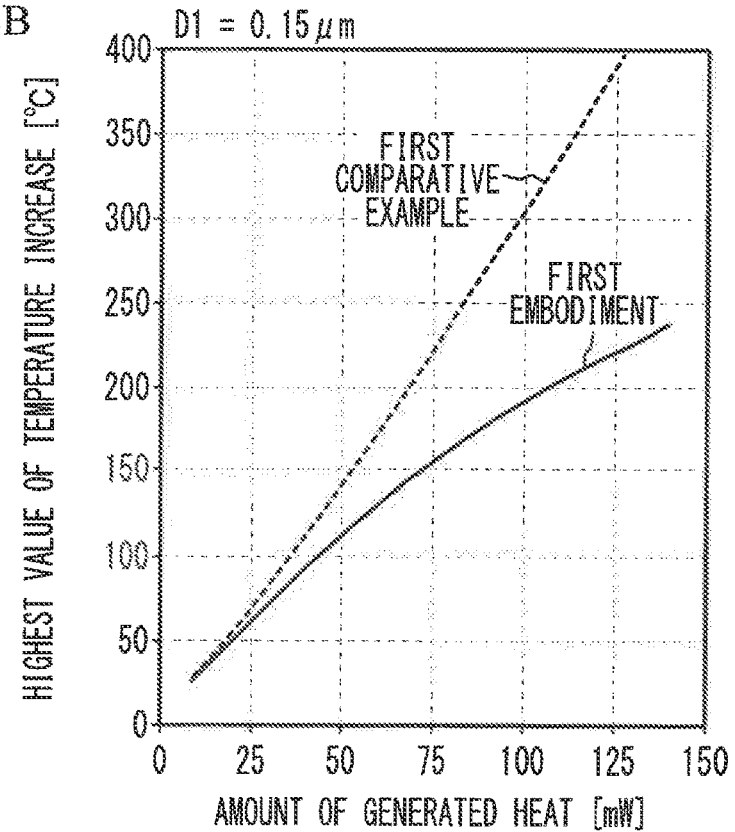
FIG. 18B is a graph of the highest value of temperature increase versus the amount of generated heat.

FIG. 18A is a graph of the displacement of the top versus the amount of generated heat in the 6.0 GHz band, and FIG. 18B is a graph of the highest value of temperature increase versus the amount of generated heat. The distance D1 is 0.15 µm. In FIG. 18A, when the displacement of the top becomes −0.15 µm or less, the top 43 comes in contact with the substrate 10. As illustrated in FIG. 18A, compared with FIG. 17A in which the distance D1 is 0.5 µm, the top is close to the upper surface of the substrate 10. As illustrated in FIG. 18B, since the top 43 becomes closer to the upper surface of the substrate 10, the highest value of temperature increase in the first embodiment is smaller than that in FIG. 17B.

As clear from the results of the simulations, in the first embodiment, the temperature increase of the multilayered film is reduced by appropriately setting the distance D1 in accordance with the size of the resonance region 50. For example, the distance D1 is preferably equal to or less than 1/50 of the shortest width passing through the center of gravity of the resonance region 50, more preferably equal to or less than 1/100 of the shortest width passing through the center of gravity of the resonance region 50, further preferably equal to or less than 1/200 of the shortest width passing through the center of gravity of the resonance region 50. This configuration reduces the temperature increase of the multilayered film 18 in the resonance region 50. The distance D1 is preferably equal to or greater than 1/1000 of the shortest width passing through the center of gravity of the resonance region 50, more preferably equal to or greater than 1/500 of the shortest width passing through the center of gravity of the resonance region 50. This configuration inhibits the lower surface of the lower electrode 12 from coming in contact with the substrate 10 under the air gap 30.

The first embodiment and the variations thereof describe a case where the planar shape of the resonance region 50 is an elliptical shape, but the planar shape of the resonance region 50 may be a polygonal shape such as a quadrangle shape or a pentagonal shape. An insertion film for improving the Q-value or a temperature compensation film for reducing the temperature coefficient of frequency may be provided in the piezoelectric film 14, between the piezoelectric film 14 and the upper electrode 16, or between the lower electrode 12 and the piezoelectric film 14.

In the first embodiment and the variations thereof, the lower electrode 12 is provided while the air gap 30 is interposed between the lower electrode 12 and the substrate 10. The upper electrode 16 is located on the piezoelectric film 14 such that the resonance region 50 where at least a part of the piezoelectric film 14 is interposed between the upper electrode 16 and the lower electrode 12 is formed and the resonance region 50 overlaps with the air gap 30 in plan view. As the temperatures of the lower electrode 12, the piezoelectric film 14, and the upper electrode 16 in the resonance region 50 become greater than the temperature of the substrate 10, the lower electrode 12 in the resonance region 50 curves such that the surface closer to the air gap 30 of the lower electrode 12 protrudes. This causes the multilayered film 18 to generate heat, and the temperature of the multilayered film 18 thereby becomes greater than that of the substrate 10, causing the multilayered film 18 to bulge downward. Thus, heat is released from the lower electrode 12 to the substrate 10 under the air gap 30, and the increase in the temperature of the multilayered film 18 is thereby reduced.

As described in the fourth variation of the first embodiment, the lower electrode 12 has a tensile stress at room temperature (i.e., the residual stress is a tensile stress), and the upper electrode 16 has a compression stress at room temperature (i.e., the residual stress is a compression stress). Thus, at room temperature, the multilayered film 18 bulges downward. Even when the multilayered film 18 does not bulge downward at room temperature, as clear from the results of the simulations, increase in the temperature of the multilayered film 18 allows the multilayered film 18 to bulge downward.

In the second through fourth variations of the first embodiment, at room temperature, the lower surface of the lower electrode 12 in the center region of the resonance region 50 (the surface facing the substrate 10 across the air gap 30) is positioned lower than the upper surface of the substrate 10 with no air gap 30 formed (the surface closer to the piezoelectric film 14 of the substrate 10 in the outside of the air gap 30 in plan view). This structure causes the multilayered film 18 to bulge downward by increase in the temperature of the multilayered film 18.

In the fourth variation of the first embodiment, at room temperature, the lower electrode 12 in the resonance region 50 has a curved shape such that the lower electrode 12 protrudes toward the air gap 30. This structure causes the multilayered film 18 to bulge downward by increase in the temperature of the multilayered film 18.

In the first and second variations of the first embodiment, the lower electrode 12 is bent outside the resonance region 50 and inside the air gap 30 such that the lower electrode 12 in the resonance region 50 is located closer to the bottom surface of the air gap 30 than the lower electrode 12 that is located outside a part, which is bent, of the lower electrode 12. This structure causes the multilayered film 18 to bulge downward by increase in the temperature of the multilayered film 18.

In the fifth variation of the first embodiment, the linear expansion coefficient of the lower electrode 12 is greater than the linear expansion coefficient of the upper electrode 16. This configuration causes the multilayered film 18 to bulge downward by increase in the temperature of the multilayered film 18. In particular, when the lower electrode 12 is bent outside the resonance region 50 and inside the air gap 30 such that the lower electrode 12 in the resonance region 50 is located closer to the bottom surface of the air gap 30 than the lower electrode 12 located outside a part, which is bent, of the lower electrode 12, the linear expansion coefficient of the lower electrode 12 is greater than the linear expansion coefficient of the upper electrode 16. This configuration causes the multilayered film 18 to bulge downward by increase in the temperature of the multilayered film 18.

In the sixth variation of the first embodiment, the lower electrode 12 includes the lower electrode 12b (a first lower electrode), and the lower electrode 12a (a second lower electrode) that is located between the lower electrode 12b and the air gap 30 and has a linear expansion coefficient greater than those of the lower electrode 12b and the upper electrode 16. This structure causes the multilayered film 18 to bulge downward by increase in the temperature of the multilayered film 18.

In the seventh variation of the first embodiment, the metal film 20 is provided so as to face the lower electrode 12 in the resonance region 50 across the air gap 30. This structure further increases the heat release performance from the multilayered film 18 in the resonance region 50.

Second Embodiment

Figure 19A:
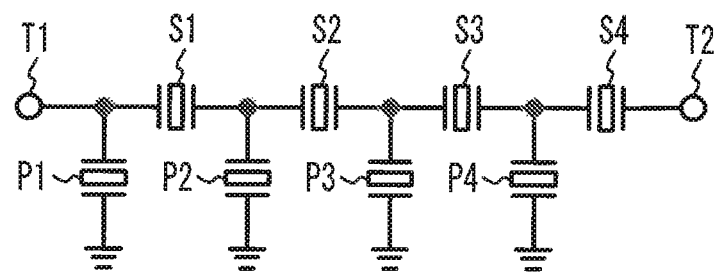
FIG. 19A is a circuit diagram of a filter in accordance with a second embodiment.

A second embodiment is an exemplary filter and an exemplary duplexer including the piezoelectric thin film resonator according to any one of the first embodiment and the variations thereof. FIG. 19A is a circuit diagram of a filter in accordance with a second embodiment. As illustrated in FIG. 19A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 may be the piezoelectric thin film resonator according to any one of the first embodiment and the variations thereof. The number of resonators in the ladder-type filter can be freely selected.

Figure 19B:
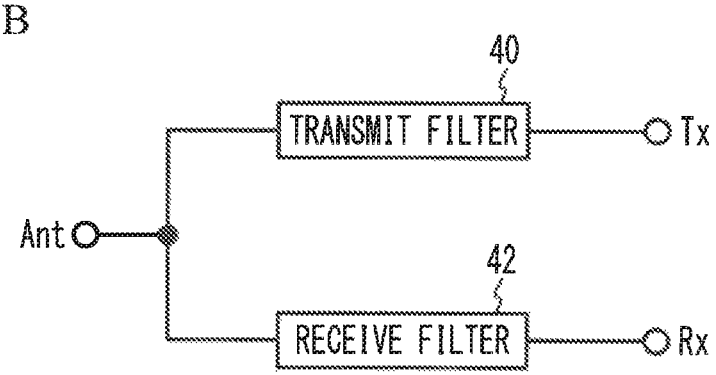
FIG. 19B is a circuit diagram of a duplexer in accordance with a first variation of the second embodiment.

FIG. 19B is a circuit diagram of a duplexer in accordance with a first variation of the second embodiment. As illustrated in FIG. 19B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the second embodiment. A high-frequency signal with large electric power is applied to the transmit filter 40. Thus, it is preferable to use the filter of the second embodiment for the transmit filter 40.

A case where the multiplexer is a duplexer has been described, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a lower electrode, an air gap being interposed between the lower electrode and the substrate;
   a piezoelectric film located on the lower electrode; and
   an upper electrode located on the piezoelectric film such that a resonance region where at least a part of the piezoelectric film is interposed between the upper electrode and the lower electrode is formed and the resonance region overlaps with the air gap in plan view, wherein
   a surface facing the substrate across the air gap of the lower electrode in a center region of the resonance region is positioned lower than a surface closer to the piezoelectric film of the substrate in an outside of the air gap in plan view, and
   a distance between the lower electrode and a bottom surface of the air gap is equal to or less than 1/50 of a shortest width through a center of gravity of the resonance region and is equal to or greater than 1/1000 of the shortest width when a high-frequency signal is not applied between the lower electrode and the upper electrode.

2. The acoustic wave device according to claim 1, wherein the lower electrode in the resonance region has a curved shape such that the lower electrode protrudes toward the air gap.

3. The acoustic wave device according to claim 1, wherein the lower electrode is bent in the first outer peripheral region and the second peripheral region such that the lower electrode in the resonance region is located closer to a bottom surface of the air gap than the lower electrode outside a part, which is bent, of the lower electrode.

4. The acoustic wave device according to claim 1, wherein a linear expansion coefficient of the lower electrode is greater than a linear expansion coefficient of the upper electrode.

5. The acoustic wave device according to claim 1, wherein the lower electrode includes a first lower electrode, and a second lower electrode that is located between the first lower electrode and the air gap, the second lower electrode having a linear expansion coefficient greater than linear expansion coefficients of the first lower electrode and the upper electrode.

6. The acoustic wave device according to claim 1, further comprising
   a metal film located so as to face the lower electrode in the resonance region across the air gap and the air gap is located between the metal film and the lower electrode in the resonance region.

7. A filter comprising:
   the acoustic wave device according to claim 1.

8. A multiplexer comprising:
   the filter according to claim 7.

9. An acoustic wave device comprising:
   a substrate;
   a lower electrode, an air gap being interposed between the lower electrode and the substrate, a residual stress of the lower electrode being a tensile stress;
   a piezoelectric film located on the lower electrode; and
   an upper electrode located on the piezoelectric film such that a resonance region where at least a part of the piezoelectric film is interposed between the upper electrode and the lower electrode is formed and the resonance region overlaps with the air gap in plan view, a residual stress of the upper electrode being a compression stress, wherein a distance between the lower electrode and a bottom surface of the air gap is equal to or less than $1/50$ of a shortest width through a center of gravity of the resonance region and is equal to or greater than $1/1000$ of the shortest width when a high-frequency signal is not applied between the lower electrode and the upper electrode.

10. The acoustic wave device according to claim 9, wherein a linear expansion coefficient of the lower electrode is greater than a linear expansion coefficient of the upper electrode.

11. The acoustic wave device according to claim 9, wherein the lower electrode includes a first lower electrode, and a second lower electrode that is located between the first lower electrode and the air gap, the second lower electrode having a linear expansion coefficient greater than linear expansion coefficients of the first lower electrode and the upper electrode.

12. The acoustic wave device according to claim 9, further comprising a metal film located so as to face the lower electrode in the resonance region across the air gap and the aft gap is located between the metal film and the lower electrode in the resonance region.

13. A filter comprising:
the acoustic wave device according to claim 9.

14. A multiplexer comprising:
the filter according to claim 13.

15. An acoustic wave device comprising:
a substrate;
a lower electrode, an air gap being interposed between the lower electrode and the substrate;
a piezoelectric film located on the lower electrode; and
an upper electrode located on the piezoelectric film such that a resonance region where at least a part of the piezoelectric film is interposed between the upper electrode and the lower electrode is formed and the resonance region overlaps with the air gap in plan view, wherein a first outer peripheral region is located between an outer edge of the resonance region and an outer edge of the air gap in a region where the lower electrode is extracted from the resonance region, the upper electrode is not located in the first outer peripheral region, and a distance between the lower electrode and a bottom surface of the air gap is equal to or less than $1/50$ of a shortest width through a center of gravity of the resonance region and is equal to or greater than $1/1000$ of the shortest width when a high-frequency signal is not applied between the lower electrode and the upper electrode.

16. The acoustic wave device according to claim 15, wherein a linear expansion coefficient of the lower electrode is greater than a linear expansion coefficient of the upper electrode.

17. The acoustic wave device according to claim 15, wherein the lower electrode includes a first lower electrode, and a second lower electrode that is located between the first lower electrode and the air gap, the second lower electrode having a linear expansion coefficient greater than linear expansion coefficients of the first lower electrode and the upper electrode.

18. The acoustic wave device according to claim 15, further comprising a metal film located so as to face the lower electrode in the resonance region across the air gap and the air gap is located between the metal film and the lower electrode in the resonance region.

19. A filter comprising:
the acoustic wave device according to claim 15.

20. A multiplexer comprising:
the filter according to claim 19.

* * * * *